(12) United States Patent
Korchemny et al.

(10) Patent No.: US 11,176,293 B1
(45) Date of Patent: Nov. 16, 2021

(54) METHOD AND SYSTEM FOR EMULATION CLOCK TREE REDUCTION

(71) Applicant: Synopsys, Inc., Mountain View, CA (US)

(72) Inventors: Dmitry Korchemny, Herzliya (IL); Alexander Rabinovitch, Marlborough, MA (US); Boris Gommershtadt, Herzliya (IL); Daniel Geist, Herzliya (IL); Srivatsan Raghavan, Mountain View, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/295,668

(22) Filed: Mar. 7, 2019

Related U.S. Application Data

(60) Provisional application No. 62/639,600, filed on Mar. 7, 2018.

(51) Int. Cl.
*G06F 30/30* (2020.01)
(52) U.S. Cl.
CPC .................................. *G06F 30/30* (2020.01)
(58) Field of Classification Search
CPC .... G06F 30/30; G06F 30/3323; G06F 30/396; G06F 30/327; G06F 30/3312; G06F 30/33; G06F 30/398; G06F 2119/12; G06F 30/00
See application file for complete search history.

(56) References Cited

U.S. PATENT DOCUMENTS

| | | |
|---|---|---|
| 5,448,497 A | 9/1995 | Ashar et al. |
| 5,980,092 A | 11/1999 | Merryman et al. |
| 6,745,377 B2 * | 6/2004 | Baumgartner .......... G06F 30/33 716/113 |
| 6,785,873 B1 | 8/2004 | Tseng |
| 8,443,317 B2 * | 5/2013 | Hiraoglu ............. G06F 30/3323 716/107 |
| 8,713,509 B2 | 4/2014 | Arbel et al. |
| 8,719,743 B1 * | 5/2014 | Kollaritsch ......... G06F 30/3312 716/104 |
| 8,863,067 B1 * | 10/2014 | Caldwell ............... G06F 30/398 716/132 |
| 8,941,426 B1 * | 1/2015 | Drake .............. G01R 31/31725 324/750.3 |
| 9,135,375 B1 * | 9/2015 | Sood ....................... G06F 30/00 |

(Continued)

OTHER PUBLICATIONS

Gomes, et al., "Chapter 2, Satisfiability Solver," Handbook of Knowledge Representation, Edited by F. van Harmelen, et al. 2008, doi:10.1016/S1574-6526(07)03002-7, pp. 89-134 (2007).

*Primary Examiner* — Nha T Nguyen
(74) *Attorney, Agent, or Firm* — Weaver Austin Villeneuve & Sampson LLP

(57) ABSTRACT

The independent claims of this patent signify a concise description of embodiments. A method is provided for reducing a size of an emulation clock tree for a circuit design. The method comprises identifying a fan-in cone of an input of a sequential element of the circuit design; identifying one or more fan-in cone sequential elements which do not directly affect the input of the sequential element; and removing the one or more identified fan-in cone sequential elements of the fan-in cone from the emulation clock tree. This Abstract is not intended to limit the scope of the claims.

28 Claims, 11 Drawing Sheets

(56) References Cited

U.S. PATENT DOCUMENTS

| | | | |
|---|---|---|---|
| 9,542,523 B2* | 1/2017 | Priel | G06F 30/398 |
| 9,665,670 B1* | 5/2017 | Pedersen | G06F 9/45508 |
| 9,922,157 B1* | 3/2018 | Ebeling | G06F 30/34 |
| 9,934,342 B1* | 4/2018 | Huang | G06F 30/327 |
| 10,248,746 B1* | 4/2019 | Bisht | G06F 30/33 |
| 10,303,202 B1* | 5/2019 | Adya | G06F 1/08 |
| 10,372,850 B2* | 8/2019 | Iyer | G06F 30/3323 |
| 10,621,297 B1* | 4/2020 | Baumgartner | G06F 30/327 |
| 2002/0178427 A1* | 11/2002 | Ding | G06F 30/331 716/103 |
| 2003/0121013 A1* | 6/2003 | Moon | G06F 30/3312 716/134 |
| 2003/0192018 A1* | 10/2003 | Baumgartner | G06F 30/33 716/108 |
| 2006/0129961 A1* | 6/2006 | Paul | G06F 30/30 716/103 |
| 2006/0190869 A1* | 8/2006 | Baumgartner | G06F 30/3323 716/103 |
| 2006/0212837 A1* | 9/2006 | Prasad | G06F 30/3323 716/106 |
| 2007/0022394 A1* | 1/2007 | Ghosh | G06F 30/3323 716/102 |
| 2007/0028157 A1* | 2/2007 | Drake | G06F 11/1666 714/797 |
| 2007/0106963 A1* | 5/2007 | Baumgartner | G06F 30/3323 716/103 |
| 2008/0040694 A1* | 2/2008 | Acuna | G06F 30/30 716/103 |
| 2009/0013289 A1 | 1/2009 | Arbel et al. | |
| 2011/0271242 A1* | 11/2011 | Baumgartner | G06F 30/33 716/103 |
| 2014/0282350 A1* | 9/2014 | Chang | G06F 30/327 716/136 |
| 2014/0289694 A1* | 9/2014 | Ma | G06F 30/394 716/129 |
| 2015/0269298 A1* | 9/2015 | Dai | G06F 30/327 716/134 |
| 2016/0103943 A1* | 4/2016 | Xia | G06F 30/398 716/108 |
| 2016/0365857 A1* | 12/2016 | Stevens | H03K 21/40 |
| 2017/0061057 A1* | 3/2017 | Lee | G06F 30/39 |
| 2017/0109466 A1* | 4/2017 | Guerin | G06F 30/331 |
| 2017/0124240 A1* | 5/2017 | Baumgartner | G06F 30/327 |
| 2017/0221550 A1* | 8/2017 | Diril | G11C 7/22 |
| 2018/0082004 A1* | 3/2018 | Liu | G06F 30/3323 |

* cited by examiner

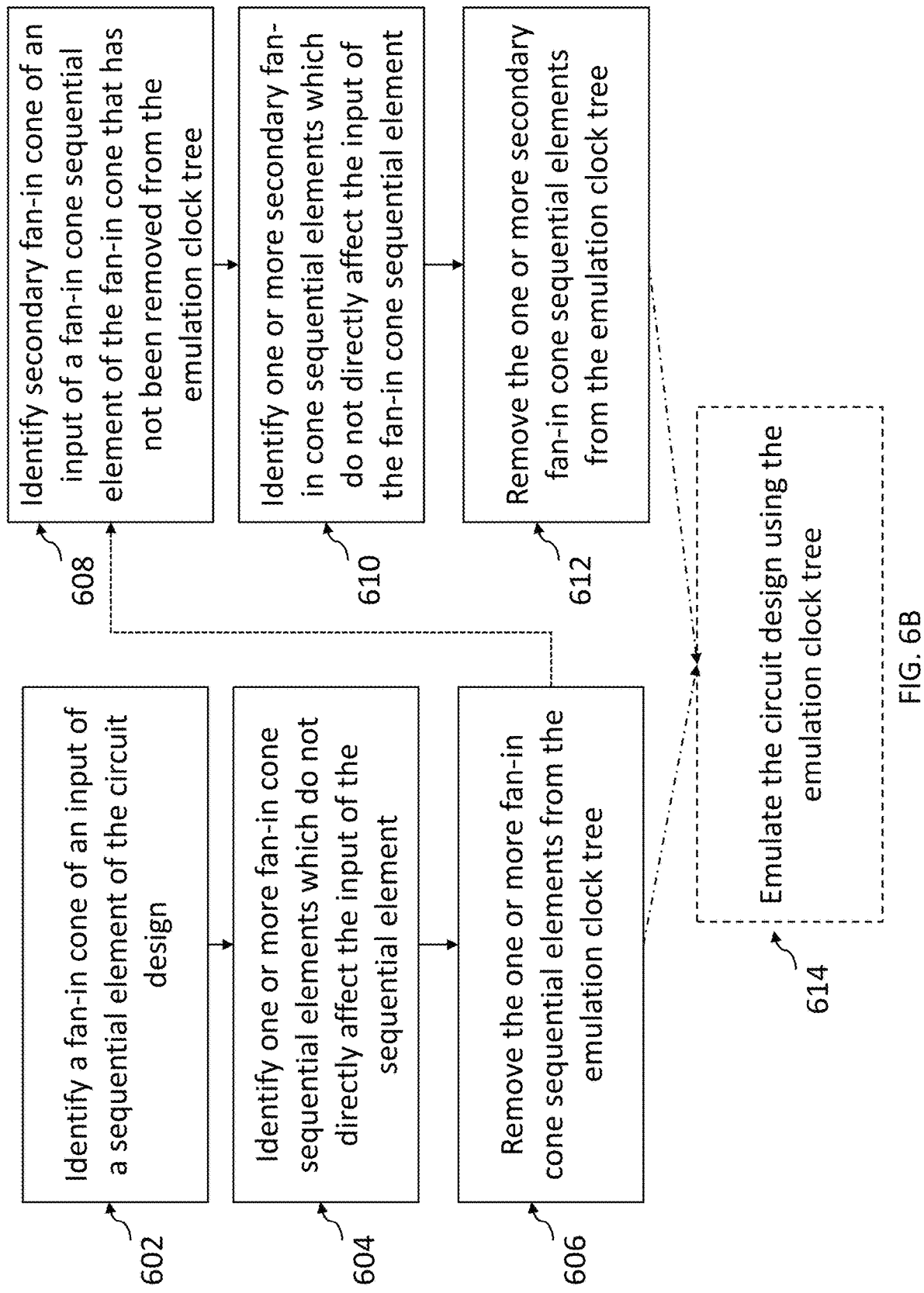

METHOD AND SYSTEM FOR EMULATION CLOCK TREE REDUCTION

CROSS REFERENCE TO RELATED APPLICATIONS

The present application claims the benefit of priority to U.S. Provisional Patent Application No. 62/639,600, titled "EMULATION CLOCK TREE REDUCTION USING FORMAL TECHNIQUES," filed Mar. 7, 2018, the contents of which are incorporated herein by reference in their entirety.

COPYRIGHT NOTICE

The assignee of this patent document has no objection to the facsimile reproduction by anyone of the patent document itself or of the patent application, as it appears in the files of the United States Patent and Trademark Office, but otherwise reserves all rights whatsoever in any included works of authorship protected by copyright.

Specification—Disclaimer

In the following Background, Summary, and Detailed Description, headings should not be construed as necessarily limiting. In the following Background, Summary and Detailed Description, the citation or identification of any publication does not signify relevance or status as prior art for any of the claimed or described embodiments. Paragraphs for which the text is all italicized signifies text that is common to multiple Synopsys patent specifications.

BACKGROUND

In electronic design automation (EDA) environments, hardware emulation is increasingly becoming an important tool for hardware design verification along with traditional RTL simulation. The emulation performance and capacity are one of the distinguishing factors between industrial emulators. Emulation performance is defined by the length of the emulation clock cycle.

The known attempts to reduce the emulation clock size are based on the topological analysis of the circuit to identify specific patterns for cutting the emulation clock tree. This approach has several important drawbacks: the known patterns do not cover all cases where the clock tree may be reduced, so that the clock reduction is not aggressive enough; the patterns highly depend on the design methodology, so that to handle a new design, the patterns have to be crafted anew.

SUMMARY

The claims signify a brief description of one or more of the innovations, embodiments, and/or examples found within this disclosure.

In embodiments, a method for reducing a size of an emulation clock tree for a circuit design, comprises identifying a fan-in cone of an input of a sequential element of the circuit design. In embodiments, the method further comprises identifying one or more fan-in cone sequential elements which do not directly affect the input of the sequential element. In embodiments, the method further comprises removing the one or more identified fan-in cone sequential elements of the fan-in cone from the emulation clock tree.

In embodiments, the method further comprises identifying a secondary fan-in cone of an input of a fan-in cone sequential element of the fan-in cone that has not been removed from the emulation clock tree. In embodiments, the method further comprises identifying one or more secondary fan-in cone sequential elements of the fan-in cone which do not directly affect the input of the fan-in cone sequential element. In embodiments, the method further comprises removing the one or more identified secondary fan-in cone sequential elements of the secondary fan-in cone from the emulation clock tree.

In embodiments, the sequential element is one of a latch or a flip flop.

In embodiments, the fan-in cone of the input of the sequential element comprises one or more fan-in cone sequential elements.

In embodiments, identifying the one or more fan-in cone sequential elements which do not directly affect the input of the sequential element comprises determining that, when the fan-in cone sequential element is open, an output of the fan-in cone sequential element does not affect the input of the sequential element.

In embodiments, identifying the one or more fan-in cone sequential elements which do not directly affect the input of the sequential element comprises identifying that the fan-in cone sequential element is a latch, and determining that an input to the fan-in cone sequential element is stable when the fan-in cone sequential element is open.

In embodiments, identifying the one or more fan-in cone sequential elements which do not directly affect the input of the sequential element comprises identifying that the fan-in cone sequential element is a latch, and determining that the fan-in cone sequential element has a mutually exclusive clock with a fan-out latch of its fan-out.

In embodiments, identifying the one or more fan-in cone sequential elements which do not directly affect the input of the sequential element comprises identifying that the fan-in cone sequential element is a frequency divider, and determining that the fan-in cone sequential element has a mutually exclusive slow clock with a fan-out latch of its fan-out.

In embodiments, identifying the one or more fan-in cone sequential elements which do not directly affect the input of the sequential element comprises identifying that the fan-in cone sequential element is a flip flop, and determining that an input to the fan-in cone sequential element does not rise when a fan-out latch of its fan-out is open.

In embodiments, the method further comprises emulating the circuit design using the emulation clock tree.

In embodiments, the identifying is performed using SystemVerilog Assertions (SVA).

In embodiments, identifying that a fan-in cone sequential element of a sequential element does not directly affect an input of the sequential element comprises determining that replacing an output value of the fan-in cone sequential element at a time t with a previous value at time t−1 of the fan-in cone sequential element does not change a value of the input of the sequential element.

In embodiments, the sequential element is a flip flop and the input is a clock input of the flip flop; the sequential element is a latch and the input is an enable input of the latch; the input is an asynchronous reset of the sequential element; or the sequential element is a latch and the input is a data input of the latch.

In embodiments, identifying the one or more fan-in cone sequential elements which do not directly affect the input of the sequential element comprises applying formal techniques to one of determine an absence of direct effect or establish a relationship between clocks.

In embodiments, the method further comprises applying pruning techniques with subexpression elimination to accelerate the application of formal techniques to determine the absence of direct effect.

This Summary does not attempt to completely signify any particular innovation, embodiment, or example as it can be used in commerce. Additionally, this Summary is not intended to signify essential elements of an innovation, embodiment or example or to limit the scope of the subject matter of this disclosure.

The innovations, embodiments, and/or examples found within this disclosure are not all-inclusive, but rather describe the basic significance of the subject matter. Accordingly, one use of this Summary is as a prelude to a Detailed Description presented later.

DRAWINGS

The following Detailed Description, Figures, appended Additional Figures and appended Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale, and are part of the Disclosure.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

FIG. 6B illustrates an exemplary emulation clock tree reduction algorithm for use with embodiments of the present disclosure.

Figure 1:
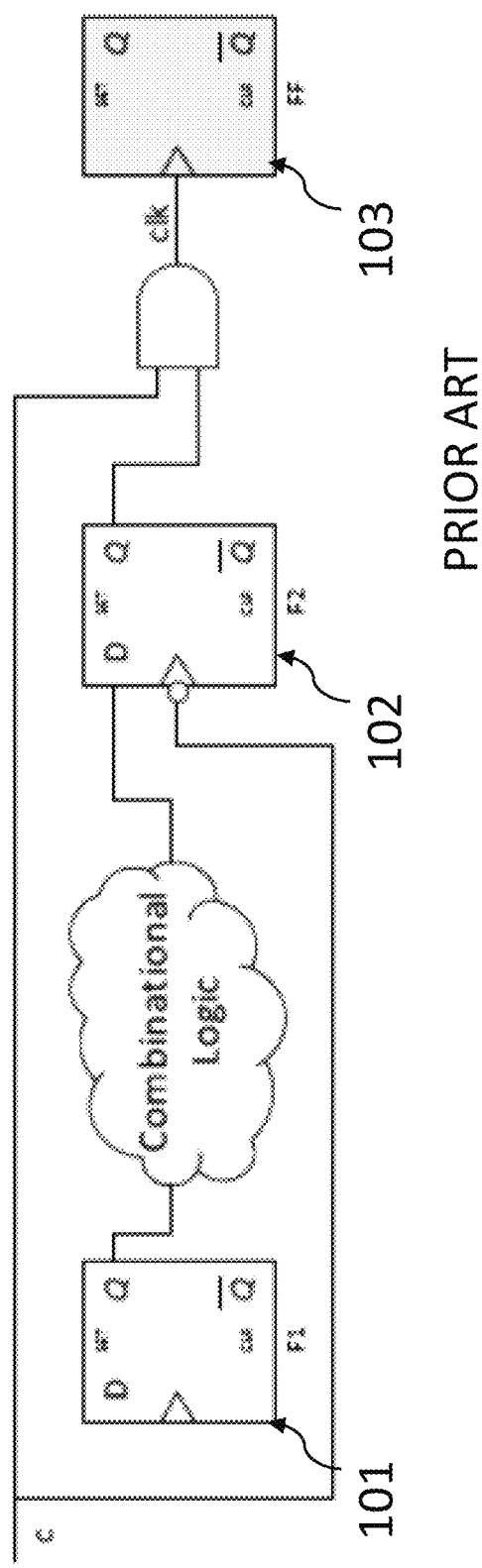
FIG. 1 illustrates an exemplary circuit clock path.

In such various figures, reference signs may be omitted as is consistent with accepted engineering practice; however, one of ordinary skill in the art will understand that the illustrated components are readily understood when viewed in context of the illustration as a whole and the accompanying disclosure describing such various figures.

DETAILED DESCRIPTION

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to enable one or more of the exemplary innovations, embodiments and/or examples. In the interest of not obscuring the presentation of the exemplary innovations, embodiments and/or examples in the following Detailed Description, some processing steps or operations that are known in the art may be combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. Instead, the following description is focused on the distinctive features or elements of various exemplary innovations, embodiments and/or examples. Furthermore, while this description may refer to some components of the structure in the singular tense, more than one component may be depicted throughout the Figures and like components are labeled with like numerals.

As used herein, the term "emulation clock tree" refers to part of the logic belonging to combinational paths starting from a primary input or an output of a flip flop, and ending at a clock input of at least one sequential element—a latch or a flip flop, in the emulation model of a hardware design, which should be evaluated during the same emulation cycle for evaluating a correct value of all sequential elements. Assuming the hardware design is in a stable state and values of one or more clock signals are changing at the beginning of an emulation cycle, the emulation clock tree comprises the smallest circuit that is necessary to be re-computed in order to obtain new values for all design clocks. The term "design clock" refers to a signal connected to a clock input of a latch or flip flop. The below example illustrates that the size of the emulation clock tree is critical to the emulation performance—e.g., the length of the emulation cycle.

One of the ways to reduce an emulation clock cycle is to split up long combinational paths which drive clock inputs of sequential elements. By way of example, and with reference to FIG. 1, register F2 102 belongs to the clock path going from output Q of register F1 101 to clock input clk of register FF 103. For correct emulation of the design, F2 102 has to be implemented as a combinational circuit—a MUX combining the current values and the values sampled by the emulation clock. This implementation results in a long combinational path, which may affect the length of the emulation clock cycle. However, when c is low, clk is also low, whatever the value of output Q of F2 is. When c is high then F2 102 stores its previous value, so its output does not change (the same argument is applicable when F2 102 is a latch). Therefore, F2 102 acts as an enable register, and the value of clk is completely defined by the previous value of the output of F2 102. For this reason, F2 102 does not need to be considered part of the clock path. It may be represented in emulation as a conventional register, and emulated in parallel with the combinational path from F2.Q to elk. Other benefits of the present embodiments include a reduction of the total number of gates (Look-Up Tables, LUTs) required to emulate the design as well as possible avoidance of multiplexor (MUX) translation when a sequential element of its fan-in cone can be excluded from the emulation clock tree.

By way of further example and with further reference to FIG. 1, consider the data path F1- - ->F2 and F2 - - ->clk. If F2 is excluded from the emulation clock tree (e.g., excluded from the fan-in cone for clk), the paths F1- - ->F2 and F2 - - ->clk can be propagated in parallel; each of them finishes in a single emulation cycle. If F2 is not excluded from the emulation clock tree (e.g., not excluded from the fan-in cone for clk), the combined long path F1 - - -> F2 - - ->clk must be propagated in a single emulation cycle; this is a much more difficult timing requirement than if F2 were to be excluded from the emulation clock tree. The ability to exclude F2 from an emulation clock tree results in direct improvement in the emulation frequency.

In some emulation methods and with further reference to FIG. 1, F2 is converted to a LUT and, thus, the two propagation paths are concatenated into one if F2 cannot be excluded. In yet other emulation methods, a bypass circuit may be introduced when outputs of F1 are connected via a combinational path to the clock of FF (i.e., bypassing F2), which still results in a longer propagation then one from F1 to F2 (this is done to predict a value of clk ahead of the edge of c). Excluding F2 from the clock cone in the bypass approach eliminates a need to create a combinational path from F1 to clk. In either of these methods (namely, the LUT or bypass methods), the ability to exclude F2 results in a shorter combinational path and, accordingly, performance gain.

Embodiments disclosed herein enable reduction of the emulation clock tree size without affecting the correctness of the emulation results, using formal analysis. These embodiments may be applied to any design, resulting in much more aggressive clock tree reduction. As illustrated in the examples above, embodiments disclosed herein enable direct improvements in emulation frequency as a result of exclusion of one or more sequential elements from an emulation clock tree.

Some of the features and benefits of these embodiments are as follows:
 a. Applying formal verification techniques for emulation clock tree reduction;
 b. Using formal methods for checking relations between clocks, including clocks generated by frequency dividers from other clocks;
 c. Breaking combinational loops in the clock tree; and
 d. Applying optimizations to manage the formal verification problem size:

Using multiple BDD managers to avoid BDD blow up.
 Pruning clock-tree assertion cone to speedup assertion verification.

The present disclosure further enable exclusion of such evaluation of fan-in cones of certain sequential elements in emulation considerations. That is, the present disclosure utilizes properties of various circuits and/or circuit elements such that evaluation of the emulation clock tree with a latest value (e.g., at time t) of a latch or flip flop in the emulation clock tree would produce the same result as an evaluation that uses its previous value (e.g., at time t−1). In embodiments, such evaluations are formulated using SystemVerilog assertions language and subsequently reduced to technology called formal verification.

The aforementioned reduction in evaluations enables considerable performance savings in emulation.

Definitions

References to "one embodiment" or "an embodiment" do not necessarily refer to the same embodiment, although they may. Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively, unless expressly limited to a single one or multiple ones. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list, unless expressly limited to one or the other. Any terms not expressly defined herein have their conventional meaning as commonly understood by those having skill in the relevant art(s).

Various logic functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on.

The term "sequential element" refers to an electronic logic element whose output depends not only on the present value of its input signals but on the sequence of past inputs (i.e., the input history) as well. Examples of sequential elements include latches and flip flops. A "combinational element" refers to an electronic logic element whose output is only a function of the present input. Sequential elements can be synchronous (e.g., the state of the device changes only at discrete times in response to a clock signal on the element's clock input) or asynchronous (e.g., can change at any time in response to changing inputs).

The terms "fan-in cone" and "fan-in" for a sequential element refer to those elements (i.e., sequential or combinational; can be a single element, multiple elements, etc.) whose outputs lead to an input of the sequential element.

The term "fan-out" refers to those elements (i.e., sequential or combinational; can be a single element, multiple elements, etc.) that receive an output of the sequential element and are, therefore, possibly driven by the output of the sequential element.

The term "direct effect" refers to a dependency of values of clocks in an IC design upon a sequential element when it is open. For example, if when a particular sequential element of the IC design is open, the values of the clocks do not depend on its output, the sequential element does not provide a direct effect.

The term "transparent" refers to a characteristic of a sequential element wherein an input data signal of the sequential element causes an immediate change in its output signal. For a latch, the word transparent comes from the fact that, when the enable input is on, the signal propagates directly through the circuit from the input to the output. For example, when a latch is enabled it becomes transparent.

The term "open" refers to one of two states of a sequential element (i.e., a latch). The other state of the sequential element is "closed." One of the two states represents a logic 1 and the other represents a logic 0. In examples, a latch is said to be open when the latch is enabled and a path from its input to its output is "transparent."

As used herein, a "flip-flop" or "latch" is a circuit or sequential element that has two stable states and can be used to store state information. A flip-flop can be made to change state by signals applied to one or more control inputs and will have one or two outputs. It is the basic storage element in sequential logic. Flip-flops and latches are fundamental building blocks of digital electronics systems used in computers, communications, and many other types of systems.

Extended Clock Tree

The term "extended clock tree" refers to the logic belonging to paths of a hardware design leading to and ending at a clock input of at least one sequential element—a latch or a flip flop—in the emulation model of the hardware design. It will be appreciated that the clock input may, instead, be one of a data input, an enable input, or an asynchronous reset input, depending on the sequential element. It will also be appreciated that the at least one sequential element may be a part of a fan-in of another sequential element of the extended clock tree. The extended clock tree represents the original emulation clock tree before any optimizations have been applied to it (for convenience, it is assumed that by the stage of the clock tree analysis all original tristate logic elements have been resolved into sequential and combinational FPGA primitives).

Each path of the hardware design traverses both combinational (logic gates or LUTs) and sequential elements whose outputs have a path to the aforementioned clock or other input, such as chains of logic gates and/or LUTs and/or flip flops and/or latches. Thus, the fan-in paths do not propagate through synchronous inputs of flip flops—their data, synchronous enables and resets—but the fan-in paths do propagate through their clock and asynchronous set and reset inputs. The fan-in paths of the extended clock tree propagate though latch data inputs due to potential latch transparency: when a latch is open, it acts as a combinational logic element.

Figure 2:
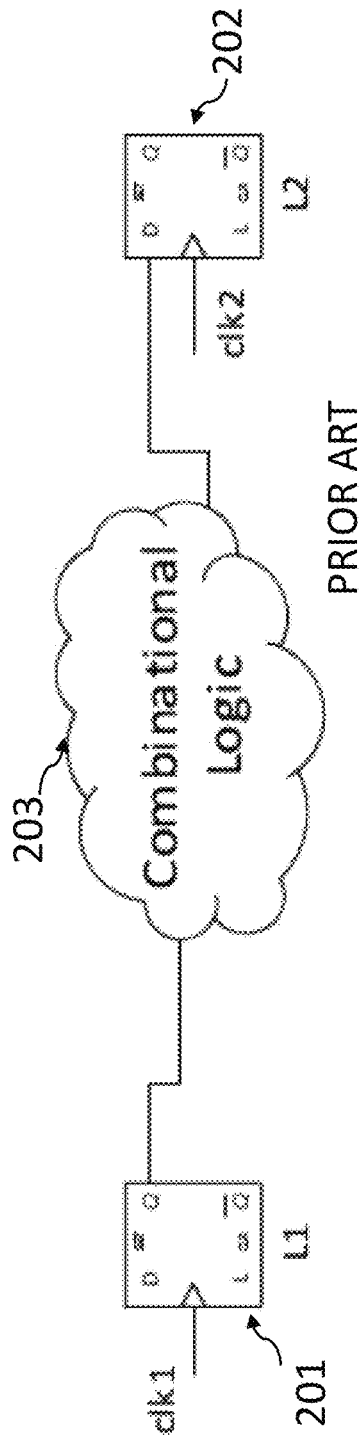
FIG. 2 illustrates an exemplary circuit having two latches that are back-to-back.

By way of example, and with reference to FIG. 2, a first latch L1 201 has a clock input signal clk1, a second latch L2 202 has a clock input signal clk2. Combinational logic 203 exists between latch L1 201 and latch L2 202. In the example in FIG. 2, when both clk1 and clk2 are logic 1 (i.e., have a value 1), both latches L1 201 and L2 202 are open. Therefore, if latch L2 202 belongs to the extended clock tree, so does latch L1 201.

Figure 3:
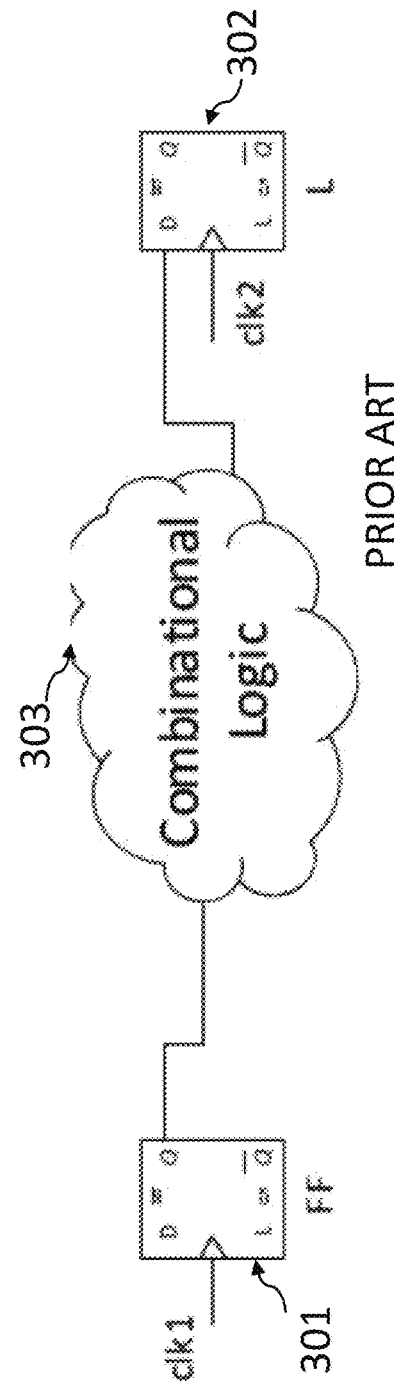
FIG. 3 illustrates an exemplary circuit having a flip-flop and latch that are back-to-back.

By way of further example, and with reference to FIG. 3, a flip flop FF 301 has a clock input signal clk1, a latch 2 302 has a clock input signal clk2. Combinational logic 303 exists between flip flop FF 301 and latch L 302. In the example in FIG. 3, if clk2 is logic 1 (i.e., has a value of 1) when clk1 rises from logic 0 to logic 1, flip flop FF 301 has a combinational path (e.g., 303) to latch L 302. Therefore, if latch L 302 belongs to the extended clock tree, so does flip flop FF 301.

Extended Clock Tree Redundancy

The extended clock tree, defined above, contains redundant logic which may be excluded from the clock tree without affecting the emulation correctness. That is, logic elements are considered redundant if they may be removed from the clock tree without affecting emulation correctness. Among the sources of the redundancy (i) absence of direct effect; (ii) latch data input stability; (iii) non-transparent back to back latches; and (iv) non-transparent back to back latch and flip flop.

Absence of Direct Effect.

A sequential element is said to have no direct effect within the extended clock tree if, when the sequential element is open, no clock values depend on its output. For example, if a sequential element has been placed into the extended clock tree only because it has a combinational path to some clock inputs of other sequential elements of the IC design, but when this sequential element is open, the values of the clocks do not depend on its output, this sequential element does not need to be part of the clock tree.

Figure 4:
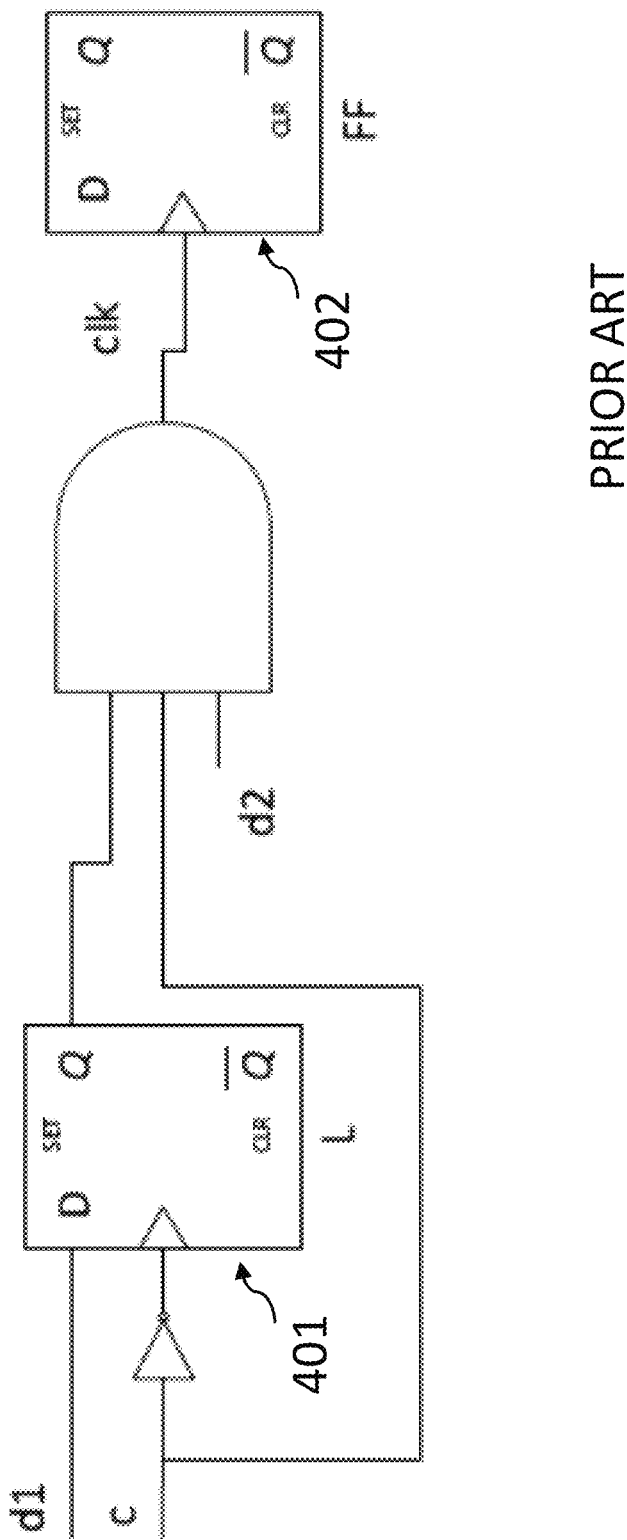
FIG. 4 illustrates an exemplary circuit having a latch that does not have an effect on the flip-flop to which it is connected.

As an example, and with reference to FIG. 4, latch L 401 (having clock input clk) belongs to the extended clock tree because it is part of the combinational fan-in cone of flip flop FF 402. However, when latch L 401 is open, the value of c is logic 0, and thus, clk is also logic 0. Therefore, when latch L 401 is open, it has no direct effect on the value of clk. When it is closed, there is obviously no combinational path passing through it to clk. For this reason, latch L 401 may be excluded from the emulation clock tree.

Latch Data Input Stability.

If a flip flop affects a particular clock directly, there is no need to consider sequential elements in the combinational fan-in cone of its (i.e., the flip flop's) data input, because there is no combinational path from the flip flop data input to its output. However, if a latch affects a particular clock directly, it might be necessary to analyze the sequential elements in its combinational fan-in for possible removal to reduce the emulation clock tree. If the latch input is stable when the latch is open, there is no need to analyze the sequential elements in its combinational fan-in, but if it is not, those sequential elements whose outputs may change when the latch is open, may cause a change in the latch data input. This analysis may be done directly, but usually it is expensive, and it may be replaced with stronger transparency checks as described herein. Though these transparency checks are less accurate, and they may lead to a larger clock tree, in practice they allow a good enough reduction of the clock tree.

Nontransparent Back-to-Back Latches.

If a latch has been placed into the extended clock tree only because there is a latch in its combinational fan-out, which belongs to the extended clock tree, and the former latch has a mutually exclusive clock with the latter latch, the former latch does not need be part of the clock tree. Thus, if in FIG. 2, the condition !(clk1 & clk2) always holds, then latch L1 201 may be excluded from the clock tree.

Nontransparent Back-to-Back Latch and Flip Flop.

If a flip flop has been placed into the extended clock tree only because there is a latch in its combinational fan-out, which belongs to the extended clock tree, and the clock of the flip flop does not rise when this fan-out latch is open, the flip flop does not need to be part of the emulation clock tree (herein it is assumed that the flip flop is open on the rising edge of its clock. If the flip flop is activated by the falling edge of its clock, then in the above description the falling edge should be used instead of the rising one). Thus, if in FIG. 3, the condition !((posedge clk1) && clk2) always holds, then flip flop FF 301 may be excluded from the clock tree. The notation here is given in pseudo-Verilog.

Identifying Sources of Redundancy

Embodiments of the present disclosure evaluate a sequential element to identify one or more sources of redundancy in order to remove redundant or transparent sequential elements from an emulation clock tree. Examples of methods for identifying sources of redundancy are explained below. In the examples that follow, the language of System-Verilog Assertions (SVA) (IEEE Standard for SystemVerilog—Unified Hardware Design, Specification, and Verification Language, 2012) is used to define the formal model of the circuit and the redundancy assertions described informally above.

In emulation, an RTL design is represented as a synchronous transition system (Clarke, Grumberg, & Peled, 1999): all signal changes are synchronized by the emulation clock, which corresponds to the system clock. In SystemVerilog this system clock is called global clock and is denoted as $global_clock.

Assertions to Check Absence of Direct Effect

In order to prove that a particular latch or a flip flop does not directly affect some clock signal clk, we need to prove that its change does not directly affect this clock at the system clock cycle. In other words, if we want to replace the value of that latch or flip flop output in the computation of the clock signal with its previous value, we will get the same clk result in the computations.

The following assertion expresses that a sequential element does not directly affect a clock clk:

$$\text{assert property } (@\$global\_clock\ clk(q) == clk(\$past\_gclk(q)), \quad (1)$$

where clk(q) is a Boolean function expressing the dependency of some clock clk on the output q of the sequential element. Function clk may also depend on the current values of other signals belonging to the boundary of the combinational fan-in cone of clk.

The transition relation for a latch with a data input d, a clock (enable) input c and output q, is:

$$q = c?d : \$past\_gclk(q), \quad (2)$$

which corresponds to the fact that the current value of the latch output q equals to the current value of its data pin d if c is high, i.e., when the latch is open. If c is low, the latch is closed, and it stores the previous value of its output q: $past_gclk(q).

Therefore, for a latch, using equation (2) assertion (1) can be rewritten as:

$$\text{assert property}(@\$global\_clock\ clk(c?d:\$past\_gclk(q)) == clk(\$past\_gclk(q))); \quad (3)$$

The transition relation for a flip flop with a data input d, a clock input c, an asynchronous active high reset input rst and output q, is:

$$q = rst?0 : (\text{"} \sim \$past\_gclk(c)\&\ c?\$past\_gclk(d) : \$past\_gclk(q)), \quad (4)$$

Therefore, for a flip flop, using equation (4), assertion (1) can be rewritten as:

$$\text{assert property}(@\$global\_clock\ clk(rst?0: (\text{"} \sim \$past\_gclk(c)\&\ c?\$past\_gclk(d):\$past\_gclk(q))) == clk(\$past\_gclk(q))); \quad (5)$$

In other embodiments, the assert property and @$global_clock may be omitted from assertions.

For the exemplary depicted in FIG. 4, the assertion becomes:

$$(\text{"} \sim c?d1 : \$past\_gclk(q))\&c\&d2 == \$past\_gclk(q) \&c\&d2 \quad (6)$$

It is readily seen that this assertion is a tautology: when c=0, its both sides equal to 0, and when c=1 both its sides are identical.

Latch Input Stability Assertions

The open latch input stability is checked with the following assertion:

$$c[*2] \rightarrow \$stable(d) \quad (7)$$

Here c is the latch enable input, assumed to be active high (if it is active low, its value should be negated), and d is the latch data input. This assertion states that whenever the enable signal remains high, the latch output does not change.

If this assertion is satisfied, there is no need to analyze sequential elements in the combinational cone of the latch. If this assertion could not be proven, the following assertions need to be checked for all sequential elements in the combinational fan-in cone of this latch:

$$c[*2]| \rightarrow \$stable(qi) \quad (8)$$

where qi is the output of the i-th sequential element in the combinational fan-in cone of the latch. If this assertion holds, this sequential element does not need to be further analyzed. Otherwise, it has also to be analyzed.

As stated above, these checks are expensive, and one can check less accurate, but cheaper non-transparency assertions instead, as described in the next section.

Non-Transparency Assertions

The following assertion checks the non-transparency of two back-to-back latches (see FIG. 2):

$$!(clk1\&clk2) \quad (9)$$

The following assertion checks the non-transparency of a back-to-back flip flop and a latch (see FIG. 3):

$$!(\$past\_gclk(clk1)\&clk1\&clk2) \quad (10)$$

This assertion means that clk1 and clk2 cannot be simultaneously high provided the previous value of clk1 was low.

The above assertion may be replaced with the stronger one, !(clk1 & clk2), which is easier to check. Doing so will result in a less aggressive clock tree reduction, but in practice, this difference may be negligible.

All the above redundancy assertions, except for latch input stability assertions, are combinational (non-temporal) in terms of the current and previous ($past_gclk( . . . )) variables of the transition system. Therefore, common formal analysis methods for combinational circuits, such as BDD (Clarke, Grumberg, & Peled, 1999—reference [2]) and SAT-solvers (Gomes, Kautz, Sabharwal, & Selman, 2007—reference [4]) can be applied directly for formal verification of the redundancy assertions.

Checking Mutual Exclusion of Slow Clock

Figure 5:
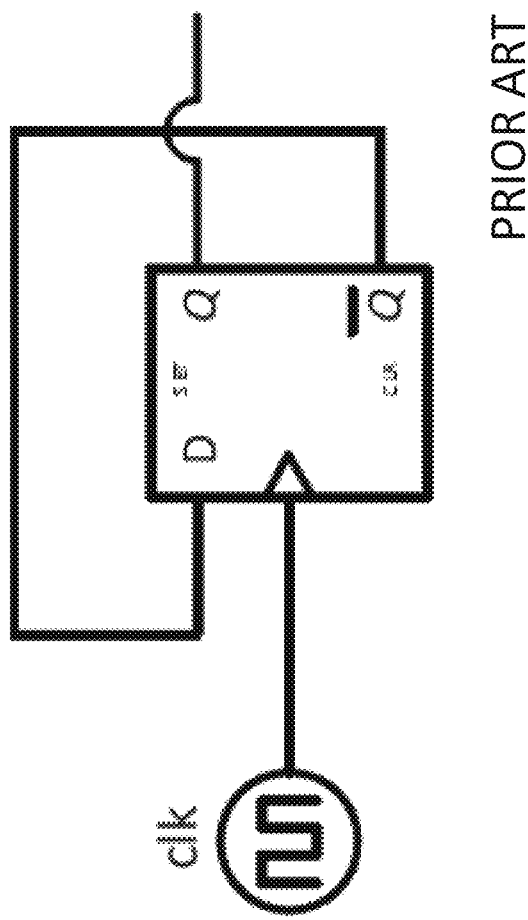
FIG. 5 depicts an exemplary frequency divider circuit.

Clock chains may contain frequency dividers, as depicted in FIG. 5. The input clocks to a frequency divider may be referred to as fast, and its output clocks referred to as slow. Since frequency dividers are sequential elements, when using the straightforward mechanism for checking non-transparency assertions, the relations between slow clocks will be lost (e.g., given two mutually exclusive fast clocks clk1 and clk2, the corresponding slow clocks sclk1 and sclk2 are also mutually exclusive). To discover the relations between slow clocks, the following method may be employed in various embodiments.

For each slow clock a Boolean expression (e.g., BDD) is built from the corresponding fast clock: if a fast clock has a form clk1=$f(c1, \ldots, c_n)$, where $c1, \ldots, c_n$ are free variables (i.e., variables that can assume any value), the corresponding fresh free variables $d1, d_n$ are introduced so that the resulting Boolean expression for sclk1 is $f(d1, \ldots, d_n)$. If another fast clock clk2 also depends on some of the variables $c1, \ldots, c_n$, the corresponding free variables $d1, \ldots, d_n$, are reused in the expression for sclk2. Therefore, if clk1 and clk2 are mutually exclusive, the same relation will be automatically proved for sclk1 and sclk2. This method works for the gated slow clocks and for the outputs of further frequency dividers of slow clocks.

Extended Clock Tree Reduction

Figure 6A:
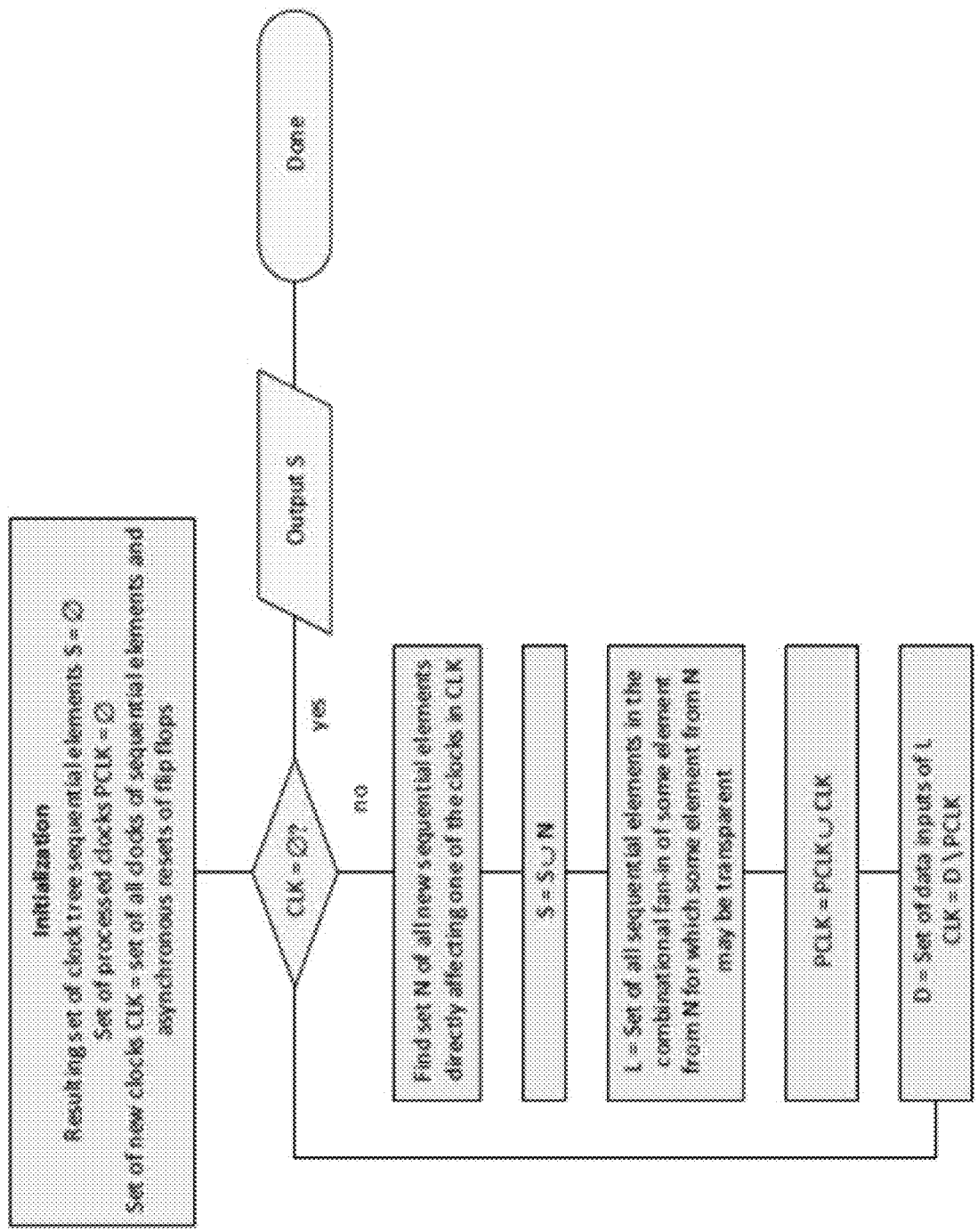
FIG. 6A illustrates an exemplary emulation clock tree reduction algorithm for use with embodiments of the present disclosure.

FIG. 6A illustrates an exemplary extended clock tree reduction algorithm for use with embodiments of the present disclosure. In embodiments, the exemplary extended clock tree reduction algorithm is implemented in one or more modules. In embodiments, the one or more modules are configured to be executed by one or more processors prior to an emulation of a hardware design using an emulation clock tree.

The input of the algorithm is the extended clock tree, which is extracted from the IS design representation. Its output is set S of sequential elements that constitute the reduced clock tree. The full reduced clock tree, containing both gates and sequential elements, is restored by its sequential elements—these elements form the boundary of the full reduced clock tree.

The algorithm maintains the following sets:

S—the set of all sequential elements that should remain in the resulting clock tree. Initially, S is empty, and at the end of the algorithm it contains the sought-for sequential elements.

CLK—the set of clocks. Initially, CLK contains the set of clocks of all sequential elements in the design, and the asynchronous set/reset inputs of the flip flops. The reason for treating the asynchronous resets as clocks is that there is a combinational path from the asynchronous set/reset input of a flip flop to its output. It is possible to extend the fan-in cones of the clocks in this algorithm to pass through the asynchronous resets of the sequential elements, which may be costly, or to treat asynchronous resets as clocks, as is shown in the block diagram, to make sure that the reset pin is not affected directly by the adjacent sequential elements. This solution is conservative and may be refined for a more aggressive clock tree reduction, but it works well in practice. The clock pins of sequential elements are also connected to their output via a combinational path, but for them no additional actions are required, because these pins are already part of CLK set.

PCLK—the set of the previously processed clocks. It is initially empty.

Other sets, which do not require an initialization, are described within the algorithm body.

The exemplary algorithm starts with the initialization of sets S, CLK and PCLK.

The exemplary algorithm proceeds with checking if CLK is empty. If so, there are no more clocks to process, and the algorithm outputs the set S of the sequential elements collected so far and stops. In the trivial case, when there are no sequential elements in the design, the algorithm stops right after the initialization, and outputs the empty set of sequential elements in the clock tree.

Otherwise, while CLK is not empty, the algorithm builds a set Q of all sequential elements belonging to the combinational fan-in cone of CLK (see also the discussion above at the definition of CLK). The elements from Q, which are already in S, do not require any special handling, since they have been identified as clock tree elements. Other elements from Q which could not be proven as non-affecting directly any element in CLK form the set N of the newly found clock tree elements, and the elements from N are inserted also into S.

To check the absence of the direct effect of an output q of a sequential element on clocks $clk1, \ldots, clk_n$, assertions of the form (3) or (5) are checked for each clock in $clk1, \ldots, clk_n$. Since there may be several sequential elements besides the current one, in the fan-in cone of clock clkj, the body of assertion (3) has the following form:

$$(x1, xi-1, ci?di:\$past\_gclk(qi), xi+1, \ldots, x_m) == f(x1, \ldots, xi-1, \$past\_gclk(qi), xi+1, \ldots, x_m) \quad (11)$$

where m is the total number of sequential elements in the combinational fan-in of the clock, i is the index of the specific sequential under consideration, ci is the clock of this sequential element, $x1, \ldots, xi-1, xi+1, \ldots, x_m$ are the fresh free variables corresponding to the outputs of other sequential elements in this cone.

Since $past_gclk(qi) is also a free variable, it may be named xi, and the above assertion gets the form:

$$i(x1, \ldots, xi-1, ci?di:xi, xi+1, \ldots, x_m) == fi(x1, \ldots, xi-1, xi, xi+1, \ldots, x_m). \quad (12)$$

When the $i^{th}$ sequential element in the combinational fan-in cone of clkj is a flip flop, the corresponding equality should be built on top of assertion (5):

$$fi(x1, \ldots, xi-1, rsti?0:((\sim\$past\_gclk(ci)\& ci?yi:xi, xi+1, \ldots, x_m) == fi(x1, \ldots, xi-1, xi, xi+1, \ldots, x_m). \quad (13)$$

Here yi is a free variable corresponding to $past_gclk(di).

The signals from CLK are marked as processed by adding them also to PCLK.

There may be a combinational path via latches from N to some of the clocks from CLK, and in order not to impact the correctness, it is needed either to extend N appropriately, or to adopt a more conservative solution, as implemented in this algorithm. The stability is checked for only the outputs of those sequential elements in the combinational fan-in cone of the latches from N, which have a transparent path through these latches. To do this, the transparency detection algorithm described above is applied. These newly identified sequential elements from the extended clock tree form a set L. The stability of the outputs of the elements from L is guaranteed by stability of their data and other synchronous inputs. The asynchronous outputs have already been considered at the initialization stage. Thus, those synchronous inputs of the elements from L, which have not been processed yet, i.e., do not belong to PCLK, are considered as new clocks, and the next iteration of the analysis starts for the newly identified clocks.

FIG. 6B illustrates an exemplary emulation clock tree reduction algorithm for use with embodiments of the present disclosure. In embodiments, the exemplary extended clock tree reduction algorithm is implemented in one or more modules. In embodiments, the one or more modules are configured to be executed by one or more processors prior to an emulation of a hardware design using an emulation clock tree.

In embodiments, an algorithm for reducing a size of an emulation clock tree for a circuit design, comprises identifying 602 a fan-in cone of an input of a sequential element of the circuit design. In embodiments, the sequential element is one of a latch or a flip flop. In embodiments, the fan-in cone of the input of the sequential element comprises one or more fan-in cone sequential elements.

In embodiments, the algorithm further comprises identifying 604 one or more fan-in cone sequential elements which do not directly affect the input of the sequential element.

In embodiments, the algorithm further comprises removing 606 the one or more identified fan-in cone sequential elements of the fan-in cone from the emulation clock tree.

In embodiments, the algorithm further comprises identifying 608 a secondary fan-in cone of an input of a fan-in cone sequential element of the fan-in cone that has not been removed from the emulation clock tree.

In embodiments, the algorithm further comprises identifying 610 one or more secondary fan-in cone sequential elements of the fan-in cone which do not directly affect the input of the fan-in cone sequential element.

In embodiments, the algorithm further comprises removing 612 the one or more identified secondary fan-in cone sequential elements of the secondary fan-in cone from the emulation clock tree.

In embodiments, identifying the one or more fan-in cone sequential elements which do not directly affect the input of the sequential element comprises determining that, when the fan-in cone sequential element is open, an output of the fan-in cone sequential element does not affect the input of the sequential element.

In embodiments, identifying the one or more fan-in cone sequential elements which do not directly affect the input of the sequential element comprises identifying that the fan-in cone sequential element is a latch, and determining that an input to the fan-in cone sequential element is stable when the fan-in cone sequential element is open.

In embodiments, identifying the one or more fan-in cone sequential elements which do not directly affect the input of the sequential element comprises identifying that the fan-in cone sequential element is a latch, and determining that the fan-in cone sequential element has a mutually exclusive clock with a fan-out latch of its fan-out.

In embodiments, identifying the one or more fan-in cone sequential elements which do not directly affect the input of the sequential element comprises identifying that the fan-in cone sequential element is a frequency divider, and determining that the fan-in cone sequential element has a mutually exclusive slow clock with a fan-out latch of its fan-out.

In embodiments, identifying the one or more fan-in cone sequential elements which do not directly affect the input of the sequential element comprises identifying that the fan-in cone sequential element is a flip flop, and determining that an input to the fan-in cone sequential element does not rise when a fan-out latch of its fan-out is open.

In embodiments, the algorithm further comprises emulating 612 the circuit design using the emulation clock tree.

In embodiments, the identifying is performed using SystemVerilog Assertions (SVA).

In embodiments, identifying that a fan-in cone sequential element of a sequential element does not directly affect an input of the sequential element comprises determining that replacing an output value of the fan-in cone sequential element at a time t with a previous value at time t−1 of the fan-in cone sequential element does not change a value of the input of the sequential element.

In embodiments, the sequential element is a flip flop and the input is a clock input of the flip flop; the sequential element is a latch and the input is an enable input of the latch; the input is an asynchronous reset of the sequential element; or the sequential element is a latch and the input is a data input of the latch.

In embodiments, identifying the one or more fan-in cone sequential elements which do not directly affect the input of the sequential element comprises applying formal techniques to one of determine an absence of direct effect or establish a relationship between clocks.

In embodiments, the algorithm further comprises applying pruning techniques with subexpression elimination to accelerate the application of formal techniques to determine the absence of direct effect.

Breaking Combinational Loops

Figure 7:
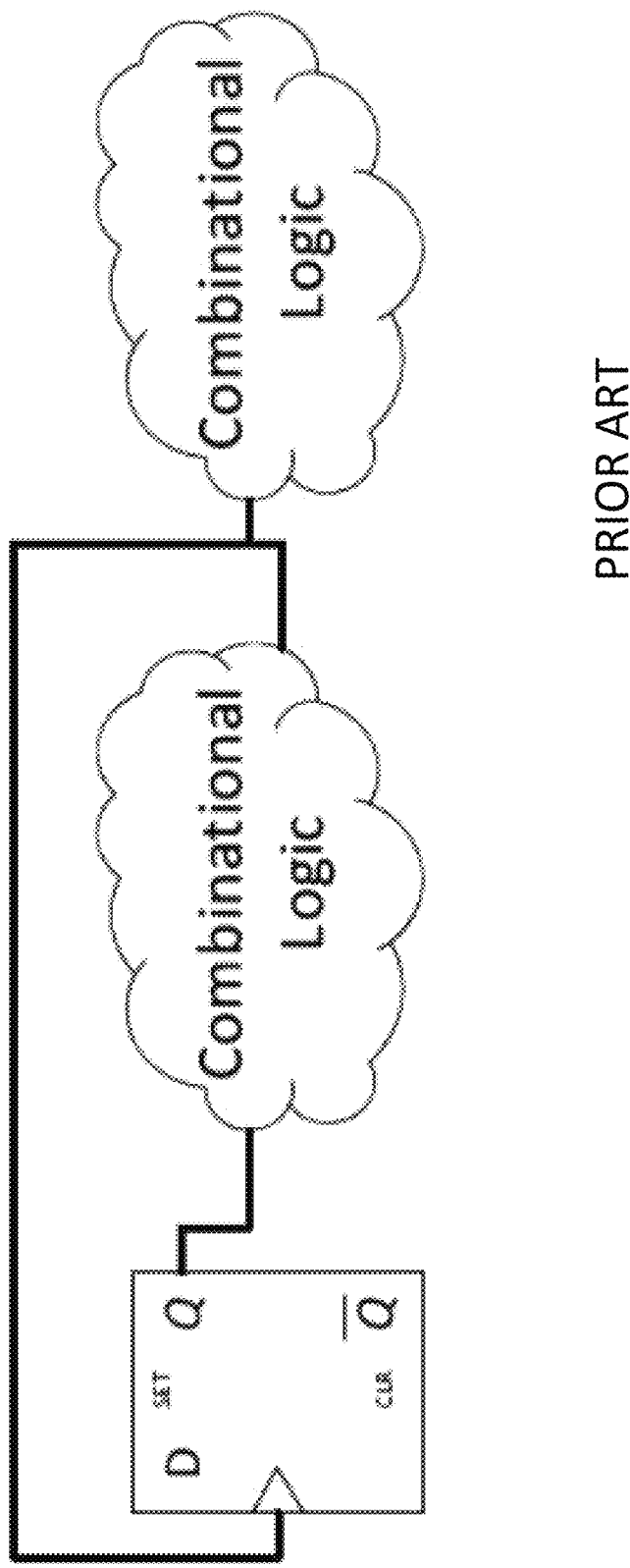
FIG. 7 illustrates an exemplary circuit having a combinatorial loop.

The algorithm described in the previous section assumes that there are no combinational loops in the extended clock tree. However, in practice, such loops do appear, e.g., as depicted in FIG. 7.

For transparency checks it is sufficient to break at any loop cut points, using any known loop detection algorithm, such as Depth First Search (DFS)-based, and associate with this cut point a fresh free variable.

This technique does not always work for the direct effect checks, because such a cut may hide a dependency on a sequential element, of one of the clocks.

To cope with this problem, no dependency is assumed between the current and the previous value of the output of the sequential element i belonging to a combinational loop. In this case, the equality (5) will be rewritten as:

$$fi(x1,\ldots,xi-1,xi,xi+1,\ldots,x_m) = fi(x1,\ldots,xi-1,yi,xi+1,\ldots,x_m),$$

where yi is a fresh free variable. This equality holds iff fi does not depend on xi, i.e., in the case of redundancy: when the sequential element i belongs to the fan-in cone of a clock, but the clock value does not depend on its state. Therefore, instead of introducing a fresh free variable yi, one can directly check that there is no dependency of fi on xi. This check is straightforward and cheap for a BDD-based representation.

Since such a redundancy occurs rarely in the real-life designs, instead of checking dependency, one can always place sequential elements at the combinational loops in the extended clock tree, into the resulting clock tree.

Optimizations

BDD-Based Implementation

The present disclosure pertains for any formal engine used, but it in many situations a BDD-based implementation has an advantage. For example, to check non-transparency assertions using BDD, one can build a BDD for each clock as a function of primary inputs and outputs of sequential elements; see also handling of slow clocks, described above. Then, checking mutual exclusion of clocks clk1 and clk2 becomes trivial: need to build a BDD for clk1 & clk2 and check that this BDD is false. Using SAT is in this case is usually much more expensive.

Using BDDs works well for very big extended clock trees: it takes about 20 secs for an extended tree with 2M sequential elements.

BDD representation is also efficient to check the absence of the direct effect. E.g., the left-hand side of equality (6) may easily be built from its right hand side by substituting xi with (ci ? di: xi). The same technique is applicable to building equality (7).

To avoid explosion, one can create a separate BDD manager for assertions related to each individual clock or for a group of thereof. Upon handling these assertions, the BDD manager should be cleaned or it can be deleted and a new one created instead. And definitely, the BDD manager(s) for the direct effect assertions should be different from the BDD manager for the latch transparency bookkeeping. If BDDs still blow up, one can analyze the assertion cone and cut off its most expensive parts to get a conservative approximation of the clock tree. The alternative is to prune the assertion cone, as described in the following section.

Assertion Cone Pruning

Another optimization is pruning the assertion cone. Doing so may drastically reduce the number of free variables in an assertion and thus, make its proof/refutation much faster. The assertions built for the clock tree reduction are usually redundant, as can be seen on the following real-life example:

$$x4=(x1?x2:x3)\&-x1$$

$$x5=-x4$$

$$x8=x5?x6:x7$$

$$x11=x5?x9:x10$$

$$x25=-(x5?x12:x13)\&(x5?x14:x15)\&(x16?x17:x18)\&-(x5?x19:x20)\&(x5?x21:x22)\&-(x5?x23:x24)$$

$$f=x25\& x4\& x11\& x8\&(x5?x26:x27)==x25\& x4\& x11\& x8\& x27$$

Above, the variables highlighted in bold are free, i.e., can assume any value: 0 or 1. There are 22 free variables, and a function $f$ dependent on 22 variables needs to be refuted. However, it is easy to see that the number of the independent free variables can be significantly reduced (e.g., when x1=1, x4=0, and when x1=0 and x3=1, x4=1). Variables x1, x2, and x3 are not part of any other expression, and thus, they may be eliminated, and x4 considered as a new free variable instead. This process may be continued until the following expression for $f$ is derived:

$$f=x25\& x4\& x11\& x8\&(x4?x27:x26)!=x25\& x4\& x11\& x8\& x27$$

Here all variables on the right-hand side are free, and their total number as a result of this pruning is only 6.

Note further, that both parts of the inequality are conjunctions, and those members that occur only once, may be assigned value 1; otherwise, the inequality cannot be satisfied. The following expression for $f$ results:

$$f=x4\&(x4?x27:x26)!=x27,$$

having only three free variables, so its satisfiability may be trivially checked with any formal engine (or, in this case, even using the full search).

For pruning, examples of algorithms that can be applied herein include adaptations of the Common Subexpression Elimination (CSE), widely used in compilers and in RTL synthesis. In this case CSE algorithm is even simpler, because only local CSE is needed, and the program is already in the static single assignment form. After CSE application, the direct effect assertion $f$ generated for a specific clock and a sequential element will be represented as a linear program of the form:

expr1= expr2=

...

expr$_n$=

LHS=

RHS=

$f$=LHS==RHS where each right-hand side may contain only free variables and the variables of the left-hand sides (expr1, expr2, . . . ) of the earlier assignments. So, each expri has one of the following forms:

$$expri=\#exprj$$

$$expri=exprj*exprk,$$

$$expri=\$(exprj,exprk,exprl\_)$$

where expri, exprk and expri are either left-hand sides of earlier assignments, so that j, k, l<i; or free variables; #, *, $ are some unary, binary and ternary Boolean operators, respectively.

If the right-hand side of expri contains a unique free variable(s), and assignments of values of the free variables may set expri both to 0 and to 1, then the entire assignment may be eliminated, and expri may be regarded as a new free variable. This procedure should be performed iteratively until no new expression may be eliminated.

For example, if expri=x & y, where x and y are unique free variables (not occurring in any other assignment), then assignment x=y=1 sets expri to 1, and any other assignment sets it to 0. If expri=x XOR exprj, and x is a unique free variable, then expri may be set to both 0 and 1 depending on the value of x. expri=exprj ? x: y, then expri may be set to both 0 and 1 depending on the values of x and y.

This pruning procedure may be done more efficiently if a dead code elimination is performed in parallel, in order not to spend the computation effort on the dead code. Namely, if as the result of the pruning procedure application, some expri does not occur anymore at the right-hand side of any other expression, it can be dropped.

Another pruning optimization mentioned in the above example, is the following: if the resulting expression for $f$, has a form of:

$$x*A!=x*B,$$

where x is a free variable, and * is a binary operator, with the dominance, i.e., if for some value of x, called a dominant value, the value of the binary expression does not depend on the value of the second operand (e.g., if *=AND, the dominant value of x is 0), then to satisfy $f$, x must be assigned its non-dominant value (1 in the case of AND).

Detailed Description—Technology Support

General Computer Explanation

Figure 9A:
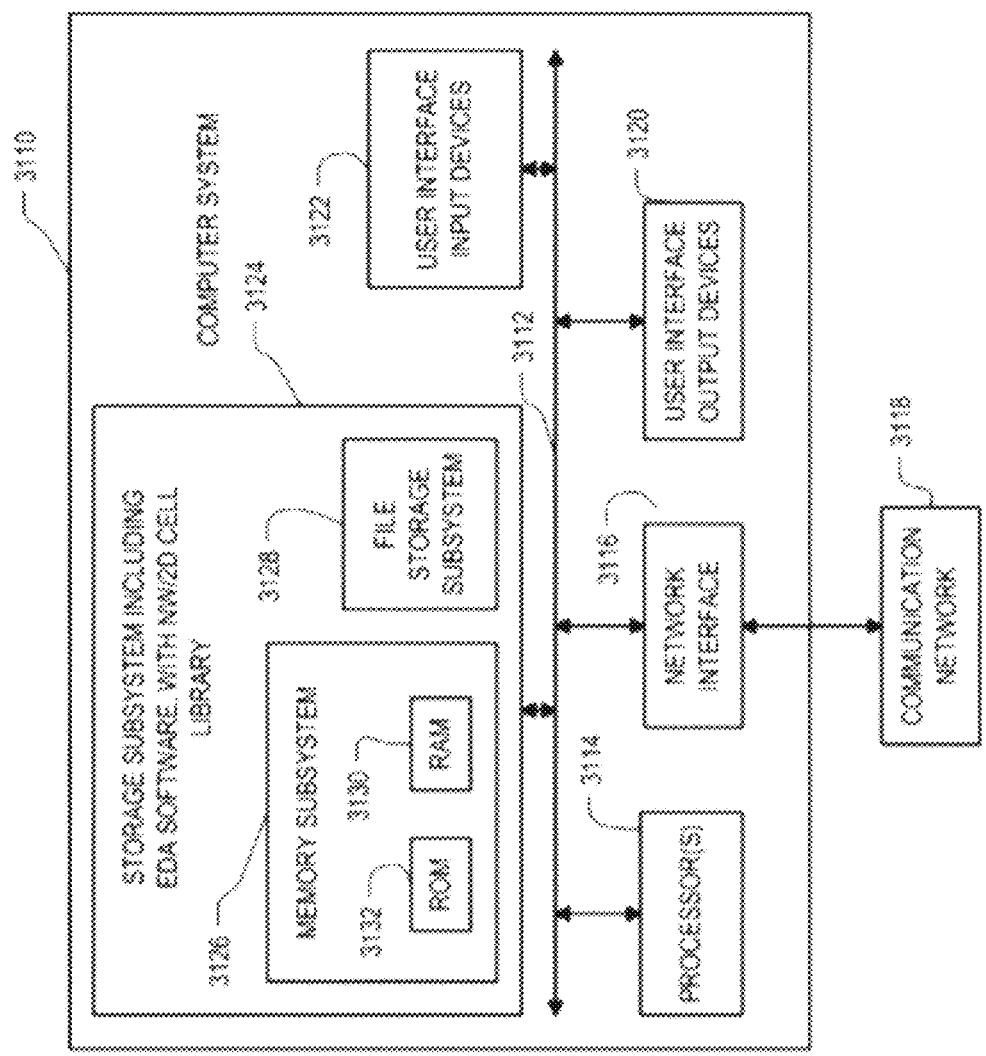
FIGS. 9A, 9B and 9C depict simplified block diagrams of a computer system suitable for use with embodiments of the technology, as well as circuit design and circuit embodiments of the technology.
Figure 9B:
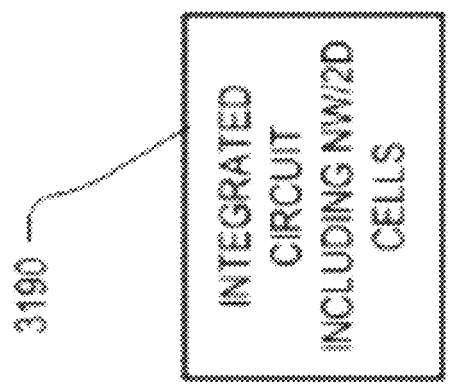
Figure 9C:
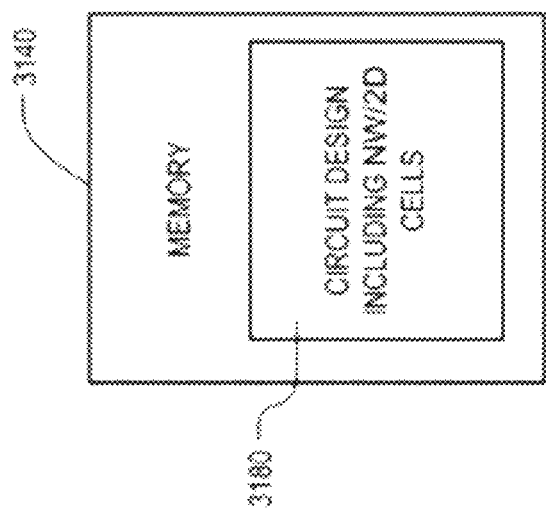

FIGS. 9A, 9B and 9C are simplified block diagrams of a computer system suitable for use with embodiments of the technology, as well as circuit design and circuit embodiments of the technology.

In FIG. 9A, computer system 3110 typically includes at least one computer or processor 3114 which communicates with a number of peripheral devices via bus subsystem 3112. Typically, the computer can include, or the processor can be, any of a microprocessor, graphics processing unit, or digital signal processor, and their electronic processing equivalents, such as an Application Specific Integrated Circuit (ASIC) or Field Programmable Gate Array (FPGA). The terms 'processor' and 'computer' are further defined below. These peripheral devices may include a storage subsystem 3124, comprising a memory subsystem 3126 and a file storage subsystem 3128, user interface input devices 3122, user interface output devices 3120, and a network interface subsystem 3116. The input and output devices allow user interaction with computer system 3110.

The computer system may be a server computer, a client computer, a workstation, a mainframe, a personal computer (PC), a tablet PC, a set-top box (STB), a personal digital assistant (PDA), a cellular telephone, a smartphone, a web appliance, a rack-mounted "blade", a kiosk, a television, a game station, a network router, switch or bridge, or any data processing machine capable of executing instructions 124 (sequential or otherwise) that specify actions to be taken by that machine.

The computer system typically includes an operating system, such as Microsoft's Windows, Sun Microsystems's Solaris, Apple Computer's MacOs, Linux or Unix. The computer system also typically can include a Basic Input/Output System (BIOS) and processor firmware. The operating system, BIOS and firmware are used by the processor to control subsystems and interfaces connected to the processor. Typical processors compatible with these operating systems include the Pentium and Itanium from Intel, the Opteron and Athlon from Advanced Micro Devices, and the ARM processor from ARM Holdings.

Innovations, embodiments and/or examples of the claimed inventions are neither limited to conventional computer applications nor the programmable apparatus that run them. For example, the innovations, embodiments and/or examples of what is claimed can include an optical computer, quantum computer, analog computer, or the like. The computer system may be a multi-processor or multi-core system and may use or be implemented in a distributed or remote system. The term 'processor' here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions 124 to perform any one or more of the sets of instructions discussed herein. Due to the ever-changing nature of computers and networks, the description of computer system 3110 depicted in FIG. 10A is intended only as one example for purposes of illustrating the preferred embodiments. Many other configurations of computer system 3110 are possible having more or less components than the computer system depicted in FIG. 9A.

Network interface subsystem 3116 provides an interface to outside networks, including an interface to communication network 3118, and is coupled via communication network 3118 to corresponding interface devices in other computer systems or machines. Communication network 3118 may comprise many interconnected computer systems, machines and communication links. These communication links may be wireline links, optical links, wireless links, or any other devices for communication of information. Communication network 3118 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 3122 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term "input device" is intended to include all possible types of devices and ways to input information into computer system 3110 or onto communication network 3118. User interface input devices typically allow a user to select objects, icons, text and the like that appear on some types of user interface output devices, for example, a display subsystem.

User interface output devices 3120 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term "output device" is intended to include all possible types of devices and ways to output information from computer system 3110 to the user or to another machine or computer system.

Memory subsystem 3126 typically includes a number of memories including a main random-access memory (RAM) 3130 (or other volatile storage device) for storage of instructions and data during program execution and a read only memory (ROM) 3132 in which fixed instructions are stored. File storage subsystem 3128 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 3128.

Bus subsystem 3112 provides a device for letting the various components and subsystems of computer system 3110 communicate with each other as intended. Although bus subsystem 3112 is shown schematically as a single bus, alternative embodiments of the bus subsystem may use multiple busses. For example, RAM-based main memory can communicate directly with file storage systems using Direct Memory Access (DMA) systems.

FIG. 9B depicts a memory 3140 such as a non-transitory, computer readable data and information storage medium associated with file storage subsystem 3128, and/or with network interface subsystem 3116, and can include a data structure specifying a circuit design. The memory 3140 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 9C signifies an integrated circuit 3190 created with the described technology that includes one or more cells selected, for example, from a cell library.

Detailed Description—Technology Support

Hardware/Software Equivalence

Some of the innovations, embodiments and/or examples described herein comprise and/or use a processor. As used herein, the term 'processor' signifies a tangible data and information processing device that physically transforms data and information, typically using a sequence transformations (also referred to as 'operations'). Data and information can be physically represented by an electrical, magnetic, optical or acoustical signal that is capable of being stored, accessed, transferred, combined, compared, or otherwise manipulated by the processor. The term "processor" can signify a singular processor and multi-core systems or multi-processor arrays, including graphic processing units, digital signal processors, digital processors or combinations of these elements.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For data and information structured in binary form, any processor that can transform the data and information using the AND, OR and NOT logical operations (and their derivatives, such as the NAND, NOR, and XOR operations) can transform the data and information using any function of Boolean logic. A processor such as an analog neural network processor can also transform data and information non-digitally. There is no scientific evidence that any of these processors are processing, storing and retrieving data and information, in any manner or form equivalent to the bioelectric structure of the human brain.

The one or more processors may also operate to support performance of the relevant operations in a 'cloud computing' environment or as a 'software as a service' (SaaS). For example, at least some of the operations may be performed by a group of processors available at a distributed or remote system, these processors accessible via a communications network (e.g., the Internet) and via one or more software interfaces (e.g., an application program interface (API).)

As used herein, the term 'module' signifies a tangible data and information processing device, that typically is limited in size and/or complexity. For example, the term 'module' can signify one or more methods or procedures that can transform data and information. The term 'module' can also signify a combination of one or more methods and procedures in a computer program. The term 'module' can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilink or Intel's Altera), Random Access Memories (RAMs) or microprocessors. A module is configured to process data and information, typically using a sequence transformations (also referred to as 'operations') applied to the data and information (or in the case of ROMs and RAMS, transforming data and information by using the input information as an address for memory that stores output data and information), to perform aspects of the present innovations, embodiments and/or examples of the invention.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The "substance" of a module's processing is independent of the form in which it is manufactured or implemented.

As used herein, the term 'algorithm' signifies a process comprising a sequence or set of operations or instructions that a module can use to transform data and information to achieve a result. A module can comprise one or more algorithms. As used herein, the term 'thread' refers to a sequence of instructions that can comprise a subset of the instructions of an entire process or algorithm. A process or algorithm can be partitioned into multiple threads that can be executed in parallel.

As used herein, the term 'computer' includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term 'software' or 'program' signifies one or more algorithms and data structures that configure a processor for use in the innovations, embodiments and examples described in this specification. Such devices configurable by software include one or more computers, for example, standalone, client or server computers, or one or more hardware modules, or systems of one or more such computers or modules. As used herein, the term "software application" signifies a set of data and instructions that configure the processor to achieve a specific result, for example, to perform word processing operations, or to encrypt a set of data.

As used herein, the term 'programming language' signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the "C" programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software, or has an interface device that receives the software over a network. This process is discussed in the General Computer Explanation section.

Detailed Description—Technology Support

EDA System/Workflow Explanation

Figure 8:
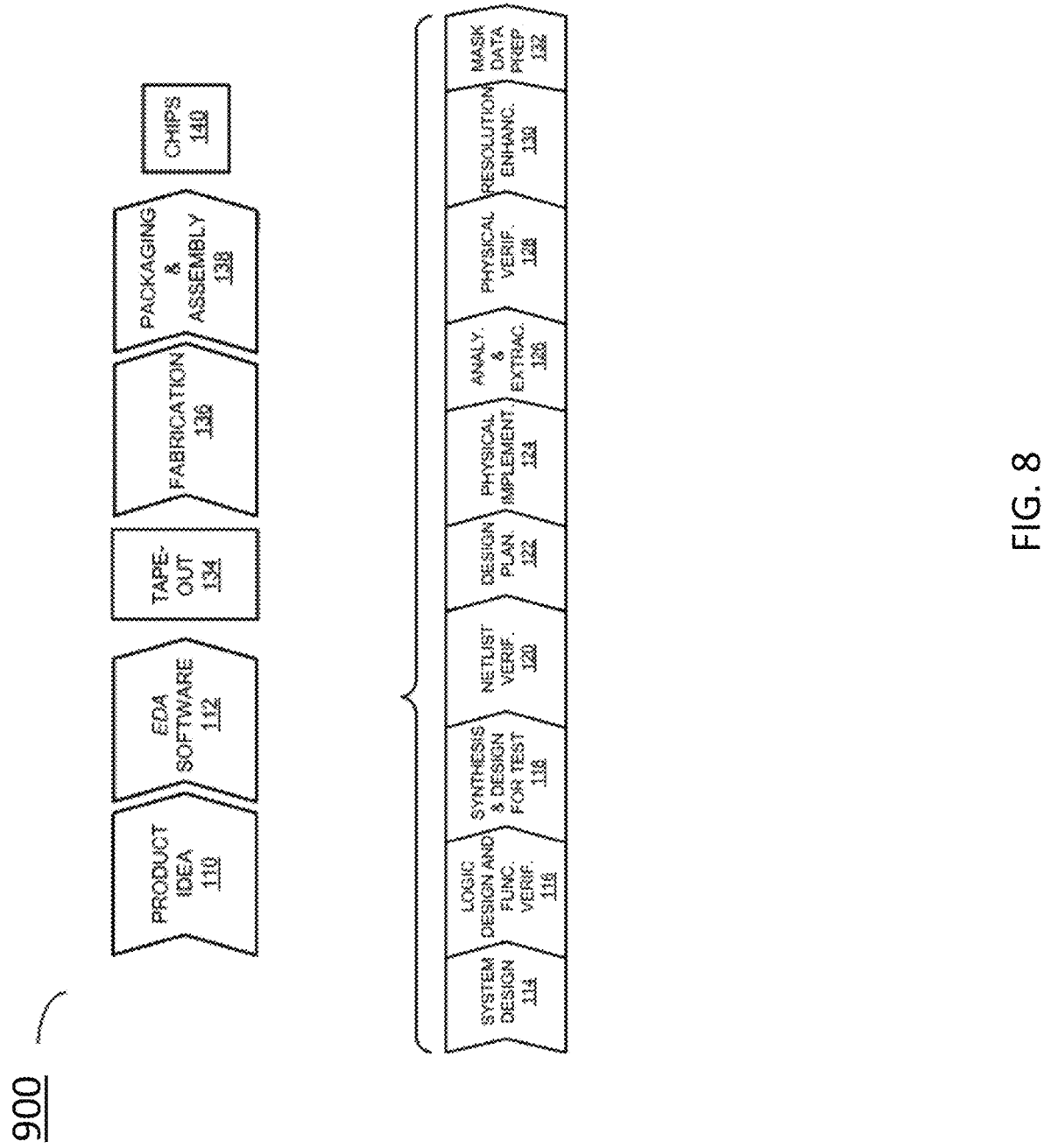
FIG. 8 depicts a flowchart of various operations in the design and fabrication of an integrated circuit in accordance with an embodiment of the present disclosure.

FIG. 8 illustrates various processes 900 performed in the design, verification and fabrication of an item of manufacture such as an integrated circuit using software tools with a computer, and possibly special hardware-assisted tools, to transform and verify design data and instructions that represent the integrated circuit. These processes start with the generation of a product idea 110 with information supplied by a designer, information which is transformed during a process to create an item of manufacture (referred to herein as a design or device) that uses an EDA software tool 112, which may also be signified herein as EDA software, as a design tool, or a verification tool. When the design is finalized, it can be taped-out 134, which typically is when artwork (e.g., geometric patterns) for the integrated circuit is sent to a fabrication facility to manufacture the mask set, which is then used to manufacture the integrated circuit. After tape-out, a semiconductor die is fabricated 136 and packaging and assembly processes 138 are performed, which result in the finished integrated circuit 140 which may also be signified herein as a circuit, device, component, chip or SoC (System on Chip).

Items of manufacture, for example, a circuit or system are used in commerce at a variety of levels of abstraction ranging from low-level transistor layouts to high-level description languages. Most designers start at high-level of abstraction to design their circuits and systems, using a hardware description language (HDL) such as VHDL, Verilog, SystemVerilog, SystemC, MyHDL or OpenVera. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level (RTL) description, a gate-level (GL) description, a layout-level description, or a mask-level description. Each lower abstraction level introduces more detail into the design description. The lower-levels of abstraction may be generated automatically by computer, derived from a design library, or created by another design automation technique. An example of a specification language at a lower level of abstraction is SPICE, much used detailed descriptions of analog-based circuits.

A design process that uses an EDA software tool 112 includes processes 114-132, which are described below. This design flow description is for illustration purposes only and is not meant to limit the present disclosure. For example, an actual integrated circuit design may require a designer to perform the design operations in a different sequence than the sequence described herein.

During system design 114, a designer describes the functionality to be manufactured. The designer can also perform what-if planning to refine the functionality and to check costs, etc. Hardware-software architecture partitioning can occur at this stage. Exemplary EDA software products from Synopsys, Inc. of Mountain View, Calif., that can be used at this stage include: Model Architect, Saber, System Studio, and Designware products.

During logic design and functional verification 116, modules in the circuit are specified in one or more hardware description languages, or HDLs, and the design in HDL is checked for functional accuracy, that is, to match the requirements of the specification of the circuit or system being designed to ensure that the design produces the correct outputs. Exemplary HDL languages are Verilog, VHDL and SystemC. Functional verification is typically done by using software-based simulators and other tools such as testbench generators, static HDL checking tools and formal verification tools. In some situations, special hardware referred to as 'emulators' or 'prototyping systems' are used to speed up the functional verification. Exemplary EDA software products from Synopsys, Inc. of Mountain View, Calif. that can be used at this stage include: VCS, Vera, Designware, Magellan, Formality, ESP and Leda products. Exemplary emulator and prototyping products also available from Synopsys that can be used at this state include: Zebu® and Protolink® (RTM="Registered Trademark").

During synthesis and design for test 118, HDL code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

During netlist verification 120, the netlist is checked for compliance with timing constraints and for correspondence with the HDL code. Exemplary EDA software products from Synopsys, Inc. of Mountain View, Calif. that can be used at this stage include: Formality, Primetime, and VCS products.

During design planning 122, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

During layout implementation 124, the physical placement (positioning of circuit elements such as transistors or capacitors) and routing (connection of the same by a plurality of conductors) occurs, as can selection of library cells to perform specific logic functions. Exemplary EDA software products from Synopsys, Inc. of Mountain View, Calif. that can be used at this stage include: the Astro and IC Compiler products.

During analysis and extraction 126, the circuit function is verified at the layout level, which permits refinement of the layout design. Exemplary EDA software products from Synopsys, Inc. of Mountain View, Calif. that can be used at this stage include: Astrorail, Primerail, Primetime, and Star RC/XT products.

During physical verification 128, the layout design is checked to ensure correctness for manufacturing constraints such as DRC constraints, electrical constraints, lithographic constraints, and circuitry function matching the HDL design specification. Exemplary EDA software products from Synopsys, Inc. of Mountain View, Calif. that can be used at this stage include the Hercules product.

During resolution enhancement 130, geometric manipulations of the layout are performed to improve manufacturability of the design. Exemplary EDA software products from Synopsys, Inc. of Mountain View, Calif. that can be used at this stage include: *Proteus* products.

During tape-out, data is created to be used (after lithographic enhancements are applied if appropriate) for production of lithography masks. Example EDA software products from Synopsys, Inc., that can be used during tape-out include the IC Compiler and Custom Designer families of products.

During mask-data preparation 132, the 'tape-out' data is used to produce lithography masks that are used to produce finished integrated circuits. Exemplary EDA software products from Synopsys, Inc. of Mountain View, Calif. that can be used at this stage include the CATS family of products.

For all of the above mentioned integrated circuit design tools, similar tools from other EDA vendors, such as Cadence, Siemens, other corporate entities or various non-commercial tools from universities, or open source repositories, can be used as an alternative.

Embodiments of the present disclosure can be used during one or more of the above-described stages. Specifically, some embodiments of the present disclosure can be used in EDA software 112.

A storage subsystem is preferably used to store the programs and data structures that provide the functionality of some or all of the EDA tools described herein, and tools applied for development of cells for the library and for physical and logical design using the library. These programs and data structures are generally executed by one or more processors in a manner known to those of ordinary skill in the art.

Detailed Description—Technology Support

Emulation Environment Explanation

Figure 10:
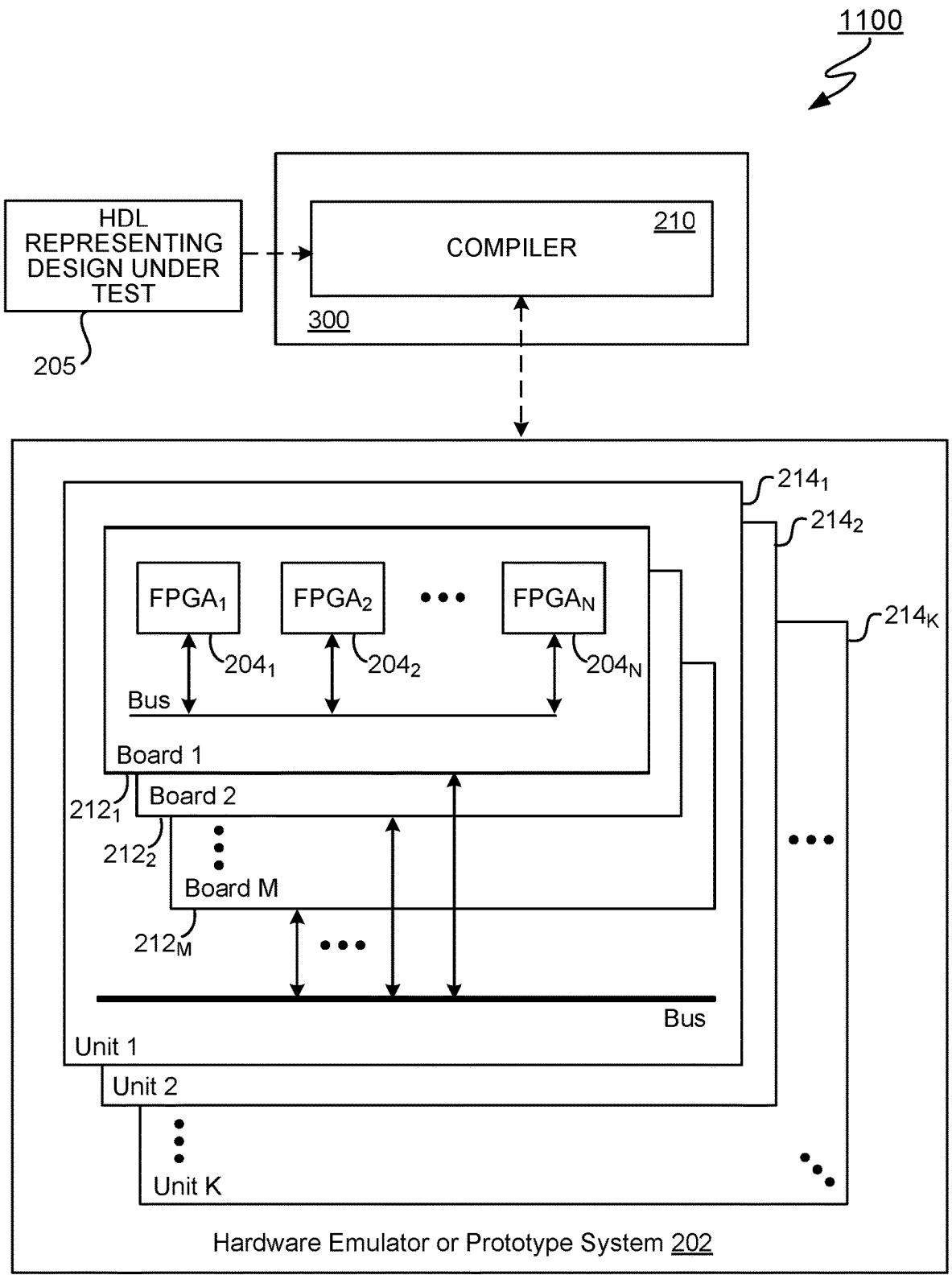
FIG. 10 depicts a block diagram of an emulation system.

An EDA software system, such as element 112 depicted in FIG. 8, typically includes an emulation system 116 to verify the functionality of the circuit design. FIG. 10 depicts a typical emulation system 1100 which includes a host computer system 300 (often part of an EDA system) and an emulator system 202 (typically a set of programmable devices such as Field Programmable Gate Arrays (FPGAs)). The host system generates data and information, typically using a compiler 210, to configure the emulator to emulate a circuit design. One of more circuit designs to be emulated are referred to as a DUT (Design Under Test). The emulator is a hardware system that emulates a DUT, for example, to use the emulation results for verifying the functionality of the DUT. One example of an emulation system that can be used for the embodiments disclosed herein is the ZeBus Server available from Synopsys, Inc.

The host system 300 comprises one or more processors. In the embodiment where the host system is comprised of multiple processors, the functions described herein as being performed by the host system may be distributed among the multiple processors.

The host system 300 typically includes a compiler 210 that processes code written in a hardware description language that represents a DUT, producing data (typically binary) and information that is used to configure the emulation system 202 to emulate the DUT. The compiler 210 may transform, change, reconfigure, add new functions to, and/or control the timing of the DUT.

The host system and emulator exchange data and information using signals carried by an emulation connection. The connection can be one or more electrical cables, for example, cables with pin configurations compatible with the RS232 or USB protocols. The connection can be a wired communication medium or network, such as a local area network, or a wide area network such as the Internet. The connection can be a wireless communication medium or a network with one or more points of access, using a wireless protocol such as Bluetooth® or IEEE 802.11. The host system and emulator can exchange data and information through a third device, such as a network server.

The emulator includes multiple FPGAs (or other programmable devices), for example, elements $204_1$ to $204_N$ in FIG. 10. Each FPGA can include one or more FPGA interfaces through which the FPGA is connected to other FPGAs of the emulator (and potentially other emulator hardware components), in order for the FPGAs to exchange signals. An FPGA interface may also be referred to as an input/output pin or an FPGA pad. While some embodiments disclosed herein make use of emulators comprising FPGAs, other embodiments can include other types of logic blocks instead of or along with, the FPGAs for emulating DUTs, for example, custom FPGAs, specialized ASICs for emulation or prototyping, memories, and input/output devices.

A programmable device may include an array of programmable logic blocks and a hierarchy of reconfigurable interconnects that allow the programmable logic blocks to be connected to each other according to the descriptions in the HDL code. Each of the programmable logic blocks can be configured to perform complex combinational functions, or merely simple logic gates, such as AND, and XOR logic blocks.

In many FPGAs, logic blocks also include memory elements, which may be simple latches, flip-flops or more complex blocks of memory. Depending on the length of the interconnections between different logic blocks, signals may arrive at input terminals of the logic blocks at different times.

Programmable processors $204_1$-$204_N$ may be placed into one or more hardware boards $212_1$ through $212_M$. Many of such boards may be placed into a hardware unit, e.g. $214_1$. The boards within a unit may be connected using the backplane of the unit or any other types of connections. In addition, multiple hardware units (e.g., $214_1$ through $214_K$) may be connected to each other by cables or any other means to form a multi-unit system. In general, the hardware emulation or prototype system 202 may be formed using a single board, a single unit with multiple boards, or with multiple units without departing from the teachings of the present disclosure.

For a DUT that is to be emulated, the emulator receives from the host system one or more bit files including a description of the DUT. The bit files further specify partitions of the DUT created by the host system with trace and injection logic, mappings of the partitions to the FPGAs of the emulator, and design constraints. Based on the bit files, the emulator configures the FPGAs to perform the functions of the DUT. With some emulators, one or more FPGAs of an emulator already have the trace and injection logic built into the silicon of the FPGA. For this type of emulator, the FPGAs don't have to be configured by the host system to emulate trace and injection logic.

The host system 110 receives (e.g., from a user) a description of a DUT that is to be emulated. In one embodiment, the DUT description is in a hardware description language (HDL), such as register transfer language (RTL). In another embodiment, the DUT description is in netlist level files, or a mix of netlist level files and HDL files. If part of the DUT description or the entire DUT description is in a HDL, the host system synthesizes the DUT description to create a gate level netlist based on the DUT description. A host system can use the netlist of the DUT to partition the DUT into multiple partitions, with some of these partitions including trace and injection logic. The trace and injection logic traces interface signals exchanged via the interfaces of an FPGA. Additionally, the trace and injection logic can be used to inject traced interface signals into the logic of the FPGA. The host system maps each partition to an FPGA of the emulator. With some emulators, the trace and injection logic is only included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic was incorporated, the bit files also describe the incorporation of the logic. The bit files may also include place and route information and design constraints. The host system stores the bit files and also stores for components of the DUT information describing which FPGAs are to emulate each component of the DUT (to which FPGAs each component is mapped).

Upon request, the host system transmits the bit files to the emulator. The host system instructs the emulator to emulate the DUT. During emulation of the DUT or at the end of the emulation, the host system receives emulation results from the emulator through the emulation connection. Emulation results are data and information generated by the emulator based on the emulation of the DUT. The emulation results include interface signals (states of interface signals) traced by the trace and injection logic of each FPGA. The host system can stores the emulation results, or transmit them to another processing system.

After emulation of the DUT, a user may request to debug a component of the DUT. If such a request is made the user may provide a time period of the emulation to debug. The host system identifies which FPGAs are configured to emulate the component based on the stored information. The host system retrieves stored interface signals associated with the time period and traced by the trace and injection logic of each identified FPGA. The host system instructs the emulator to re-emulate the identified FPGAs, either one by one, multiple at a time, or altogether. The host system transmits the retrieved interface signals to the emulator in order to re-emulate the component for the time period. The trace and injection logic of each identified FPGA injects its respective interface signals received from the host system into the logic of the DUT mapped to the FPGA. In case of multiple re-emulations of an FPGA, the results may be merged all together to have a full debug view.

The host system receives from the emulator signals traced by logic of the identified FPGAs during the re-emulation of the component. The host system stores the signals received from the emulator. The signals traced during the re-emulation can have a higher sampling rate than during the initial emulation. For example, in the initial run a traced signal may be comprised of a saved hardware state every X milliseconds. However, in the re-emulation the traced signal may be comprised of a saved hardware state every Y milliseconds, where Y is less than X. If the user requests to view a waveform of a signal traced during the re-emulation, the host system can retrieve the stored signal and display a plot of the signal (generates a waveform of the signal). Afterwards the user can, for example, request to re-emulate the same component but for a different time period or to re-emulate another component.

A host system typically comprises at least seven sub-systems: a design synthesizer, a mapping module, a run time module, a results module, a debug module, a waveform module, and a storage module. Each of these sub-systems may be embodied as hardware, software, firmware, or a combination thereof. Together these components configure the emulator, and monitor the emulation results.

The design synthesizer converts the HDL of a DUT into gate level logic. For a DUT that is to be emulated, the design synthesizer receives a description of the DUT. If the description of the DUT is fully or partially in HDL (e.g., RTL or other level of abstraction), the design synthesizer 210 synthesizes the HDL of the DUT to create a gate-level netlist with a description of the DUT in terms of gate level logic.

The mapping module partitions DUTs and maps partitions to emulator FPGAs. The mapping module partitions a DUT at the gate level into a number of partitions using the netlist of the DUT. For each partition, the mapping module retrieves a gate level description of the trace and injection logic and incorporates the logic into the partition. As described above, the trace and injection logic included in a partition is configured to trace signals exchanged via the interfaces of an FPGA to which the partition is mapped (trace interface signals). The trace and injection logic can be incorporated into the DUT prior to the partitioning. For example, the trace and injection logic may be incorporated by the design synthesizer prior to or after the synthesizing the HDL of the DUT. Hence, the trace and injection logic may not match the partitions, it may be a subset, a superset or even different from the partitions.

In addition to including the trace and injection logic, the mapping module may include additional tracing logic in a partition in order to trace the states of certain DUT components that are not traced by the trace and injection logic (to trace signals other than the interface signals traced by the trace and injection logic). The mapping module may include the additional tracing logic in the DUT prior to the partitioning or in partitions after the partitioning. The design synthesizer can include the additional tracing logic in an HDL description of the DUT prior to synthesizing the description.

The mapping module maps each partition of the DUT to an FPGA of the emulator. The mapping module performs the partitioning and mapping using design rules, design constraints (e.g., timing or logic constraints), and information about the emulator. For components of the DUT, the mapping module stores information in the storage module describing which FPGAs are to emulate each component.

Based on the partitioning and the mapping, the mapping module generates one or more bit files that describe the created partitions and the mapping of logic to each FPGA of the emulator. The bit files may include additional information, such as constraints of the DUT, and routing information of connections between FPGAs and connections within each FPGA. The mapping module can generate a bit file for each partition of the DUT, which can be stored in the storage module. Upon request from a user, the mapping module transmits the bit files to the emulator, which the emulator uses to configure the FPGAs to emulate the DUT.

If the emulator includes specialized ASICs that include the trace and injection logic, the mapping module may generate a specific configuration allowing to connect them to the DUT or just save the information of what traced/injected signal is and where the information is stored on the specialized ASIC.

The run time module controls emulations performed on the emulator. The run time module may cause the emulator to start or stop executing an emulation. Additionally, the run time module may provide input signals/data to the emulator. The input signals may be provided directly to the emulator through the connection or indirectly through other input signal devices. For example, the host system with the run time module may control an input signal device to provide the input signals to the emulator. The input signal device may be, for example, a test board (directly or through cables), signal generator, another emulator, or another host system.

The results module processes emulation results generated by the emulator. During emulation and/or after completing the emulation, the results module receives emulation results from the emulator generated during the emulation. The emulation results include signals traced during the emulation. Specifically, the emulation results include interface signals traced by the trace and injection logic emulated by each FPGA. The emulation results may also include signals traced by additional logic included in the DUT. Each traced signal can span multiple cycles of the emulation. A traced signal is comprised of multiple hardware states and each hardware state is associated with a time of the emulation. The results module stores the traced signals received in the storage module. For each stored signal, the results module can store information indicating which FPGA generated the traced signal.

The debug module allows users to debug DUT components. After the emulator has emulated a DUT and the results module has received the interface signals traced by the trace and injection logic during the emulation, a user may request to debug a component of the DUT by re-emulating the component fora specific time period. In a request to debug a component, the user identifies the component and indicates a time period of the emulation to debug. The user's request can also include a sampling rate that indicates how often hardware states should be saved by logic that traces signals.

The debug module identifies the one or more FPGAs of the emulator that are configured to emulate the component based on the information stored by the mapping module in the storage module. For each identified FPGA, the debug module retrieves, from the storage module, interface signals traced by the trace and injection logic of the FPGA during the time period indicated by the user (i.e., retrieve hardware states traced by the trace and injection logic that are associated with the time period).

The debug module transmits the retrieved interface signals to the emulator. The debug module instructs the debug module to run the identified FPGAs and for the trace and injection logic of each identified FPGA to inject its respective traced signals into logic of the FPGA in order to re-emulate the component for the requested time period. The debug module can also transmit the sampling rate provided by the user to the emulator so that the tracing logic traces hardware states at the proper intervals.

To debug the component, the emulator only has to run the FPGAs to which the component has been mapped. Additionally, the re-emulation of the component does not have to start from the beginning, but can start at any point desired by the user.

For an identified FPGA, the debug module can transmit instructions to the emulator to load multiple emulator FPGAs with the same configuration of the identified FPGA. The debug module additionally instructs the emulator to run the multiple FPGAs in parallel. Each FPGA from the multiple FPGAs is run with a different time window of the interface signals in order to generate a larger time window in a shorter amount of time. For example, for the identified FPGA to run a certain amount of cycles it may take an hour. However, if multiple FPGAs are loaded with the configuration of the identified FPGA and each of the FPGAs runs a subset of the cycles, it may only take a few minutes for the FPGAs to collectively run all of the cycles.

A user may identify a hierarchy or a list of DUT signals to re-emulate. To enable this, the debug module determines the FPGA needed to emulate the hierarchy or list of signals, retrieves the necessary interface signals and transmits the retrieved interface signals to the emulator for re-emulation. Hence, a user can identify any element (e.g., component or signal) of the DUT to debug/reemulate.

The waveform module generates waveforms based on traced signals. If a user requests to view a waveform of a signal traced during an emulation run, the host system retrieves the signal from the storage module. The waveform module displays a plot of the signal to the user. For one or more signals, when the signals are received from the emulator, the waveform module can automatically generate the plots of the signals.

It will be appreciated that the described embodiments relate to both emulation and prototyping applications. Emulation and prototyping are complementary technologies with the focus of Emulation being verification and the focus of FPGA-based prototyping being validation. This translates to emulation being used earlier in the design cycle as part of the verification by simulation design cycle. Of course, connecting Virtual with FPGA-Based Prototypes, enables the FPGA-based prototype to be used earlier in the design cycle but that's solving a different problem. Hybrid Prototyping is focused on enabling earlier development of hardware aware software. Emulation is complementary to prototyping as each technology is solving a different problem; in fact many of our customers utilize both emulation and prototyping in their SoC development process today. As mentioned before, Emulation systems focus on SoC verification, whereas FPGA-prototypes focus on validation tasks such as hardware validation and hw/sw integration and extend to software development and debug. Design verification means confirmation by examination and provision of objective evidence that specified requirements have been fulfilled. So basically does the design meet the functional requirements outlined in the design's functional spec.

Detailed Description—Semantic Support

The signifier 'commercial solution' signifies, solely for the following paragraph, an engineering domain-specific (and thus non preemptive—see Bilski) electronic structure, process for specified machines, manufacturable circuit (and their Church-Turing equivalents) or composition of matter that is useful in commerce to solve a problem of technology, that is, a use in commerce of an application of science or use in commerce of technology.

The signifier 'abstract' (when used in a patent claim for any embodiments disclosed herein for a new commercial solution that is a scientific application of one or more laws of nature {see Benson}, and that solves a problem of technology {see Diehr} used in commerce—or improves upon an existing commercial solution {see Diehr})—is precisely defined by the inventor(s) {see MPEP 2111.01} as follows:

a) a new commercial solution is 'abstract' if it is not novel (e.g., it is so well known in equal prior art {see Alice} and/or the use of equivalent prior art solutions is long prevalent {see Bilski} in science, engineering or commerce), and thus unpatentable under 35 U.S.C. 102, for example, because it is "difficult to understand" {see Merriam-Webster definition for 'abstract'} how the commercial solution differs from equivalent prior art solutions; or b) a new commercial solution is 'abstract' if it is obvious, that is, if the existing prior art includes at least one analogous prior art solution {see KSR}, or the existing prior art includes at least two prior art items that can be combined {see Alice} by a person having ordinary skill in the art {a "PHOSITA", see MPEP 2141-2144} to be equivalent to the new commercial solution, and is thus unpatentable under 35 U.S.C. 103, for example, because it is "difficult to understand" how the new commercial solution differs from a PHOSITA-combination/-application of the existing prior art; or c) a new commercial solution is 'abstract' if it is not disclosed with an enabling description either because there is insufficient guidance in the enabling description, or because only a generic implementation is described {see Mayo} with unspecified elements, parameters or functionality, so that a PHOSITA is unable to instantiate a useful embodiment of the new commercial solution, without, for example, requiring special programming {see Katz} or circuit design to be performed by the PHOSITA), and is thus unpatentable under 35 U.S.C. 112, for example, because it is "difficult to understand" how to use in commerce any embodiment of the new commercial solution.

Detailed Description—Conclusion

The foregoing Detailed Description signifies in isolation the individual features, structures, functions, or characteristics described herein and any combination of two or more such features, structures, functions or characteristics, to the extent that such features, structures, functions or characteristics or combinations thereof are based on the present specification as a whole in light of the knowledge of a person skilled in the art, irrespective of whether such features, structures, functions or characteristics, or combinations thereof solve any problems disclosed herein, and without limitation to the scope of the claims. When an embodiment of a claimed invention comprises a particular feature, structure, function or characteristic, it is within the knowledge of a person skilled in the art to use such feature, structure, function, or characteristic in connection with other embodiments whether or not explicitly described, for example, as a substitute for another feature, structure, function or characteristic.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein are chosen to signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described, but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

We claim:

1. An apparatus for reducing a size of an emulation clock tree of a circuit design undergoing hardware emulation, the apparatus comprising at least one processor and at least one memory storing instructions that when executed by the processor cause the processor to:
   identify a fan-in cone of an input of a sequential element of the circuit design;
   identify one or more fan-in cone sequential elements which do not directly affect the input of the sequential element, further comprising determining that, when the fan-in cone sequential element is open, the input of the sequential element is independent of an output of the fan-in cone sequential element; and
   remove the one or more identified fan-in cone sequential elements of the fan-in cone from the emulation clock tree.

2. The apparatus of claim 1, wherein the instructions further cause the processor to:
   identify a secondary fan-in cone of an input of a fan-in cone sequential element of the fan-in cone that has not been removed from the emulation clock tree;
   identify one or more secondary fan-in cone sequential elements of the fan-in cone which do not directly affect the input of the fan-in cone sequential element; and
   remove the one or more identified secondary fan-in cone sequential elements of the secondary fan-in cone from the emulation clock tree.

3. The apparatus of claim 1, wherein the sequential element is one of a latch or a flip flop.

4. The apparatus of claim 1, wherein the fan-in cone of the input of the sequential element comprises one or more fan-in cone sequential elements.

5. The apparatus of claim 1, wherein identifying the one or more fan-in cone sequential elements which do not directly affect the input of the sequential element comprises:

identifying that the fan-in cone sequential element is a latch; and
determining that an input to the fan-in cone sequential element is stable when the fan-in cone sequential element is open.

6. The apparatus of claim 1, wherein identifying the one or more fan-in cone sequential elements which do not directly affect the input of the sequential element comprises:
identifying that the fan-in cone sequential element is a latch; and
determining that the fan-in cone sequential element has a mutually exclusive clock with a fan-out latch of its fan-out.

7. The apparatus of claim 6, wherein identifying the one or more fan-in cone sequential elements which do not directly affect the input of the sequential element comprises:
identifying that the fan-in cone sequential element is a frequency divider; and
determining that the fan-in cone sequential element has a mutually exclusive slow clock with a fan-out latch of its fan-out.

8. The apparatus of claim 1, wherein the identifying is performed using SystemVerilog Assertions (SVA).

9. The apparatus of claim 1, wherein identifying that a fan-in cone sequential element of a sequential element does not directly affect an input of the sequential element comprises determining that replacing an output value of the fan-in cone sequential element at a time t with a previous value at time t−1 of the fan-in cone sequential element does not change a value of the input of the sequential element.

10. The apparatus of claim 1, wherein one of:
the sequential element is a flip flop and the input is a clock input of the flip flop;
the sequential element is a latch and the input is an enable input of the latch;
the input is an asynchronous reset of the sequential element; or
the sequential element is a latch and the input is a data input of the latch.

11. The apparatus of claim 1, wherein identifying the one or more fan-in cone sequential elements which do not directly affect the input of the sequential element comprises applying formal techniques to one of determine an absence of direct effect or establish a relationship between clocks.

12. The apparatus of claim 11, wherein the instructions further cause the processor to:
apply pruning techniques with subexpression elimination to accelerate the application of formal techniques to determine the absence of direct effect.

13. The apparatus of claim 1, wherein
identifying the one or more fan-in cone sequential elements which do not directly affect the input of the sequential element comprises:
identifying that the fan-in cone sequential element is a flip flop; and
determining that an input to the fan-in cone sequential element does not rise when a fan-out latch of its fan-out is open.

14. The apparatus of claim 1, wherein the instructions further cause the apparatus to:
emulate the circuit design using the emulation clock tree.

15. A method for reducing a size of an emulation clock tree for a circuit design undergoing hardware emulation, the method comprising:
identifying a fan-in cone of an input of a sequential element of the circuit design;
identifying one or more fan-in cone sequential elements which do not directly affect the input of the sequential element, further comprising determining that, when the fan-in cone sequential element is open, the input of the sequential element is independent of an output of the fan-in cone sequential element; and
removing the one or more identified fan-in cone sequential elements of the fan-in cone from the emulation clock tree.

16. The method of claim 15, further comprising:
identifying a secondary fan-in cone of an input of a fan-in cone sequential element of the fan-in cone that has not been removed from the emulation clock tree;
identifying one or more secondary fan-in cone sequential elements of the fan-in cone which do not directly affect the input of the fan-in cone sequential element; and
removing the one or more identified secondary fan-in cone sequential elements of the secondary fan-in cone from the emulation clock tree.

17. The method of claim 15, wherein the sequential element is one of a latch or a flip flop.

18. The method of claim 15, wherein the fan-in cone of the input of the sequential element comprises one or more fan-in cone sequential elements.

19. The method of claim 15, wherein identifying the one or more fan-in cone sequential elements which do not directly affect the input of the sequential element comprises:
identifying that the fan-in cone sequential element is a latch; and
determining that an input to the fan-in cone sequential element is stable when the fan-in cone sequential element is open.

20. The method of claim 15 wherein identifying the one or more fan-in cone sequential elements which do not directly affect the input of the sequential element comprises:
identifying that the fan-in cone sequential element is a latch; and
determining that the fan-in cone sequential element has a mutually exclusive clock with a fan-out latch of its fan-out.

21. The method of claim 20, wherein identifying the one or more fan-in cone sequential elements which do not directly affect the input of the sequential element comprises:
identifying that the fan-in cone sequential element is a frequency divider; and
determining that the fan-in cone sequential element has a mutually exclusive slow clock with a fan-out latch of its fan-out.

22. The method of claim 15, wherein identifying the one or more fan-in cone sequential elements which do not directly affect the input of the sequential element comprises:
identifying that the fan-in cone sequential element is a flip flop; and
determining that an input to the fan-in cone sequential element does not rise when a fan-out latch of its fan-out is open.

23. The method of claim 15, further comprising: emulating the circuit design using the emulation clock tree.

24. The method of claim 15, wherein the identifying is performed using SystemVerilog Assertions (SVA).

25. The method of claim 15, wherein identifying that a fan-in cone sequential element of a sequential element does not directly affect an input of the sequential element comprises determining that replacing an output value of the fan-in cone sequential element at a time t with a previous value at time t−1 of the fan-in cone sequential element does not change a value of the input of the sequential element.

26. The method of claim 15, wherein one of:
the sequential element is a flip flop and the input is a clock input of the flip flop;
the sequential element is a latch and the input is an enable input of the latch;
the input is an asynchronous reset of the sequential element; or
the sequential element is a latch and the input is a data input of the latch.

27. The method of claim 15, wherein identifying the one or more fan-in cone sequential elements which do not directly affect the input of the sequential element comprises applying formal techniques to one of determine an absence of direct effect or establish a relationship between clocks.

28. The method of claim 27, further comprising:
applying pruning techniques with subexpression elimination to accelerate the application of formal techniques to determine the absence of direct effect.

* * * * *